United States Patent
Nam et al.

(10) Patent No.: US 11,580,283 B2
(45) Date of Patent: Feb. 14, 2023

(54) AUTOMATED OPTIMIZATION OF LARGE-SCALE QUANTUM CIRCUITS WITH CONTINUOUS PARAMETERS

(71) Applicants: UNIVERSITY OF MARYLAND, COLLEGE PARK, College Park, MD (US); IonQ, Inc., College Park, MD (US)

(72) Inventors: Yunseong Nam, North Bethesda, MD (US); Dmitri Maslov, Falls Church, VA (US); Andrew Childs, Bethesda, MD (US); Neil Julien Ross, Halifax (CA); Yuan Su, Hyattsville, MD (US)

(73) Assignees: UNIVERSITY OF MARYLAND, COLLEGE PARK, College Park, MD (US); IonQ, Inc., College Park, MD (US)

( * ) Notice: Subject to any disclaimer, the term of this patent is extended or adjusted under 35 U.S.C. 154(b) by 177 days.

(21) Appl. No.: 17/165,707

(22) Filed: Feb. 2, 2021

(65) Prior Publication Data
US 2021/0192113 A1    Jun. 24, 2021

Related U.S. Application Data

(63) Continuation of application No. 16/164,586, filed on Oct. 18, 2018, now Pat. No. 10,922,457.
(Continued)

(51) Int. Cl.
*G06F 7/50*    (2006.01)
*G06F 30/327*    (2020.01)
(Continued)

(52) U.S. Cl.
CPC ............ *G06F 30/327* (2020.01); *G06F 30/39* (2020.01); *G06N 10/00* (2019.01)

(58) Field of Classification Search
USPC .................................................. 716/102, 103
See application file for complete search history.

(56) References Cited

U.S. PATENT DOCUMENTS

2006/0123363 A1    6/2006   Williams et al.
2014/0026108 A1*   1/2014   Bocharov .............. G06N 10/00
                                                          716/102
(Continued)

FOREIGN PATENT DOCUMENTS

JP    2006338185 A    12/2006
WO    2017127923 A1    8/2017

OTHER PUBLICATIONS

UK National Quantum Technologies Programme, http://uknqt.epsrc.ac.uk, accessed Oct. 10, 2017.
(Continued)

*Primary Examiner* — Brian Ngo
(74) *Attorney, Agent, or Firm* — Arentfox Schiff LLP

(57) ABSTRACT

The disclosure describes the implementation of automated techniques for optimizing quantum circuits of the size and type expected in quantum computations that outperform classical computers. The disclosure shows how to handle continuous gate parameters and report a collection of fast algorithms capable of optimizing large-scale-scale quantum circuits. For the suite of benchmarks considered, the techniques described obtain substantial reductions in gate counts. In particular, the techniques in this disclosure provide better optimization in significantly less time than previous approaches, while making minimal structural changes so as to preserve the basic layout of the underlying quantum algorithms. The results provided by these techniques help bridge the gap between computations that can be run on existing quantum computing hardware and more advanced computations that are more challenging to implement in (Continued)

quantum computing hardware but are the ones that are expected to outperform what can be achieved with classical computers.

20 Claims, 22 Drawing Sheets

Related U.S. Application Data

(60) Provisional application No. 62/574,480, filed on Oct. 19, 2017.

(51) Int. Cl.
*G06F 30/39* (2020.01)
*G06N 10/00* (2022.01)

(56) References Cited

U.S. PATENT DOCUMENTS

| | | | |
|---|---|---|---|
| 2014/0157214 A1* | 6/2014 | Ahn | B82Y 10/00 716/102 |
| 2014/0280427 A1* | 9/2014 | Bocharov | B82Y 10/00 708/200 |
| 2017/0316336 A1* | 11/2017 | Bocharov | G06F 30/327 |
| 2018/0232652 A1* | 8/2018 | Curtis | G06N 10/00 |
| 2019/0018912 A1* | 1/2019 | Mosca | B82Y 10/00 |
| 2019/0019102 A1* | 1/2019 | Babbush | G06N 10/60 |
| 2019/0205783 A1* | 7/2019 | Nam | G06F 15/8007 |
| 2019/0370679 A1* | 12/2019 | Curtis | G06F 16/9024 |

OTHER PUBLICATIONS

D. W. Berry, G. Ahokas, R. Cleve, and B. C. Sanders, "Efficient quantum algorithms for simulating sparse Hamiltonians", Communications in Mathematical Physics, 270(2):359-371, (2007).
S. Bravyi and A. Kitaev, "Universal quantum computation with ideal Clifford gates and noisy ancillas", Physical Review A, 71:022316, (2005).
Certicom, Certicom ECC challenge, https://www.certicom.com/content/certicom/en/ the-certicom-ecc-challenge.html. accessed Apr. 28, 2017.
D. Coppersmith, "An approximate Fourier transform useful in quantum factoring", (1994).
S. Debnath, N. M. Linke, C. Figgatt, K. A. Landsman, K. Wright, and C. Monroe, "Demonstration of a small programmable quantum computer with atomic qubits", Nature, 536:63-66, (2016).
T. Draper, "Addition on a quantum computer", (2000).
R. P. Feynman, "Simulating physics with computers", International Journal of Theoretical Physics, 21(6-7):467-488, (1982).
Fortune, "IBM sets sight on quantum computing", http://fortune.com/2017/03/06/ ibm-quantum-computer/, accessed: May 31, 2017.
A. G. Fowler, M. Mariantoni, J. M. Martinis, and A. N. Cleland, "Surface codes: Towards practical largescale quantum computation", Physical Review A, 86:032324, (2012).
E. Gibney, "Europe's billion-euro quantum project takes shape", Nature, 545(7652):16, (2017).
A. S. Green, P. L. Lumsdaine, N. J. Ross, P. Selinger, and B. Valiron, "Quipper: A scalable quantum programming language", ACM SIGPLAN Notices, 48(6):333-342, (2013).
IBM, "IBM makes quantum computing available on IBM cloud to accelerate innovation", https://www-03. ibm.com/press/us/en/pressrelease/49661.wss, Accessed: May 31, 2017.
IBM Research, "Quantum Experience", http://www.research.ibm.com/quantum/, Accessed: May 31, 2017.
Intel, "Intel invests US$50 million to advance quantum computing", https://newsroom.intel.com/ news-releases/intel-invests-us50-million-to-advance-quantum-computing/, Accessed: May 31, 2017.
D. Janzing, P. Wocjan, and T. Beth, "Identity check is QMA-complete", (2003).

V. Kliuchnikov, D. Maslov, and M. Mosca, "Fast and efficient exact synthesis of single qubit unitaries generated by Clifford and T gates", Quantum Information & Computation, 13(7-8):607-630, (2013).
A. K. Lenstra, H. W. Lenstra, Jr., M. S. Manasse, and J. M. Pollard, "The Number Field Sieve, In Proceedings of the Twenty-second Annual ACM Symposium on Theory of Computing", STOC '90, pp. 564-572, (1990).
S. Lloyd, "Universal quantum simulators", Science, 273(5278):1073-1078, (1996).
J. Markoff, "Microsoft spends big to build a computer out of science fiction", https://www.nytimes.com/ 2016/11/21/technology/microsoft-spends-big-to-build-quantum-computer.html, Nov. 21, 2016.
D. Maslov, "Advantages of using relative-phase Toffoli gates with an application to multiple control Toffoli optimization", Physical Review A, 93:022311, (2016).
D. Maslov, "Optimal and asymptotically optimal NCT reversible circuits by the gate types", Quantum Information and Computation, 16(13-14):1096-1112, (2016).
D. Maslov, G. W. Dueck, D. M. Miller, and C. Negrevergne, "Quantum circuit simplification and level compaction", IEEE Transactions on Computer-Aided Design of Integrated Circuits and Systems, 27(3):436-444, (2008).
MIT Technology Review, "Google's quantum dream machine", https://www.technologyreview.com/s/ 544421/googles-quantum-dream-machine/, Accessed: May 31, 2017.
M. A. Nielsen and I. L. Chuang, "Quantum Computation and Quantum Information", Cambridge University Press, (2002).
NIST, "Quantum Algorithm Zoo", http://math.nist.gov/quantum/zoo/, Accessed: May 31, 2017.
Office of the President, Washington, DC, USA, "Advancing Quantum Information Science: National Challenges and Opportunities", https://www.whitehouse.gov/sites/whitehouse.gov/files/images/, Quantum Info Sci Report 2016 07 22final.pdf, 2016, Accessed: May 31, 2017.
A. K. Prasad, V. V. Shende, I. L. Markov, J. P. Hayes, and K. N. Patel, "Data structures and algorithms for simplifying reversible circuits", ACM Journal of Emerging Technologies in Computing Systems, 2(4):277-293, (2006).
M. Reiher, N. Wiebe, K. M. Svore, D. Wecker, and M. Troyer, "Elucidating reaction mechanisms on quantum computers", Proceedings of the National Academy of Sciences, 114(29):7555-7560, (2017).
R. L. Rivest, A. Shamir, and L. Adleman, "A method for obtaining digital signatures and public-key cryptosystems", Communications of the ACM, 21(2):120-126, (1978).
N. J. Ross and P. Selinger, "Optimal ancilla-free Clifford+T approximation of z-rotations", Quantum Information & Computation, 16(11 &12):901-953, (2016).
M. Saeedi and I. L. Markov, "Synthesis and optimization of reversible circuits—a survey", ACM Computing Surveys, 45(2): Article 21, (2013).
P. W. Shor, "Polynomial-time algorithms for prime factorization and discrete logarithms on a quantum computer", SIAM Journal on Computing, 26(5):1484-1509, (1997).
Practical Quantum Computers by Russ Juskalian, MIT Technology Review, Feb. 2017.
R. Van Meter and K. M. Itoh, Fast quantum modular exponentiation. Physical Review A, 71:052320, (2005).
Wikipedia, "RSA factoring challenge", https://en.wikipedia.org/wiki/RSA Factoring Challenge, Accessed: May 31, 2017.
Nam, Y.S., et al., "Scaling laws for Shor's algorithm with a banded quantum Fourier transform", Department of Physics, Wesleyan University, Mar. 27, 2018.
Folwer, Austin G., et al., "A bridge to lower overhead quantum computation", Cornell University, V4 Apr. 9, 2013.
O'Gorman, Joe, et al., "Quantum computation with realistic magic state factories", Physical Review A, 95, 032338, Mar. 31, 2017.
Heyfron, Luke E., et al., "A Efficient Quantum Compiler that Reduces T Count", Quantum Science and Technology, Sep. 12, 2018.
Bareno, Adrano, et al., "Elementary gates for quantum computation", Physical Review A, 52, 3457, Mar. 22, 1995.

(56) References Cited

OTHER PUBLICATIONS

Lloyd, Seth, "Universal Quantum Simulators", Research Articles, Science, vol. 273, Aug. 23, 1996.

International Written Opinion corresponding to International Application No. PCT/US2018/056764, dated Nov. 18, 2019.

International Search Report and Written Opinion corresponding to International Application No. PCT/US2018/056764, dated Feb. 4, 2019 (21 pages).

Amy, Matthew, et al., "Polynomial-Time T-Depth Optimization of Clifford+T Circuits Via Matroid Partitioning", IEEE Transactions on Computer-Aided Design of Integrated Circuits and Systems, vol. 33, No. 10, Oct. 2014 (14 pages).

Abdessaied, Nabilia, et al., "Quantum Circuit Optimization by Hadamard Gate Reduction", Springer International Publishing, Jan. 1, 2014 (14 pages).

Maslov, Dmitri, "Basic circuit compliation techniques for an ion-trap quantum machine", ARXIV.org, Cornell University Library, Mar. 24, 2016 (15 pages).

Amy, Matthew, et al., "A Meet-in-the-Middle Algorithm for Fast Synthesis of Depth-Optimal Quantum Circuits", IEEE Transactions on Computer-Aided Design of Integrated Circuits and Systems, vol. 32, No. 6, Jun. 2013 (13 pages).

Nam, Yunseong, et al., "Automated optimization of large quantum circuits with continous parameters", ARXIV.org, Cornell Univeristy, retreived from URL "https://arixv.org/pdf/1710.07345.pdf", Jun. 1, 2018 (21 pages).

* cited by examiner

Table 1. Light optimization of adder circuits: QFA (top) and Quipper library (bottom)

| n | Gate counts for approximate QFA | | | | | | | | | Software runtime (seconds) |
|---|---|---|---|---|---|---|---|---|---|---|
| | Before optimization | | | | After optimization | | | | | |
| | CNOT | T | $R_z$ | x | | CNOT | T | x | $R_z$ | x | |
| 8 | 184 | 266 | 76 | 16 | | 184 | 56 | 28 | 122 | 16 | <0.001 |
| 16 | 716 | 602 | 172 | 32 | | 716 | 120 | 60 | 420 | 32 | 0.001 |
| 32 | 1900 | 1274 | 364 | 64 | | 1900 | 248 | 124 | 1076 | 64 | 0.002 |
| 64 | 4268 | 2618 | 748 | 128 | | 4268 | 504 | 252 | 2388 | 128 | 0.004 |
| 128 | 9004 | 5306 | 1516 | 256 | | 9004 | 1016 | 508 | 5012 | 256 | 0.08 |
| 256 | 18,476 | 10,682 | 3052 | 512 | | 18,476 | 2040 | 1020 | 10,260 | 512 | 0.018 |
| 512 | 37,420 | 21,434 | 6124 | 1024 | | 37,420 | 4088 | 2044 | 20,756 | 1024 | 0.045 |
| 1024 | 75,308 | 42,938 | 12,288 | 2048 | | 75,308 | 8184 | 4092 | 41,748 | 2048 | 0.115 |
| 2048 | 151,084 | 85,946 | 24,556 | 4096 | | 151,084 | 16,376 | 8188 | 83,732 | 4096 | 0.215 |

| n | Gate counts for Quipper library adder | | | | | | | | | Software runtime (seconds) |
|---|---|---|---|---|---|---|---|---|---|---|
| | Before optimization | | | | After optimization | | | | | |
| | CNOT | T | x | p | | CNOT | T | x | $R_z$ | p | |
| 8 | 243 | | | 0 | | 143 | 56 | 28 | 122 | 12 | 0.001 |
| 16 | 547 | | | 0 | | 319 | 120 | 60 | 420 | 28 | 0.003 |
| 32 | 1155 | | | 0 | | 671 | 248 | 124 | 1076 | 60 | 0.014 |
| 64 | 2371 | | | 0 | | 1375 | 504 | 252 | 2388 | 124 | 0.057 |
| 128 | 4803 | | | 0 | | 2783 | 1016 | 508 | 5012 | 252 | 0.244 |
| 256 | 9667 | | | 0 | | 5599 | 2040 | 1020 | 10,260 | 508 | 1.099 |
| 512 | 19,395 | | | 0 | | 11,231 | 4088 | 2044 | 20,756 | 1020 | 5.292 |
| 1024 | 38,851 | | | 0 | | 22,495 | 8184 | 4092 | 41,748 | 2044 | 25.987 |
| 2048 | 77,763 | | | 0 | | 45,023 | 16,376 | 8188 | 83,732 | 4092 | 145.972 |

Table 2. Heavy optimization of Quipper library adder

| n | Gate counts for Quipper library adder | | | | | | | Software runtime (seconds) |
|---|---|---|---|---|---|---|---|---|
| | Before optimization | | | | After optimization (H) | | | |
| | CNOT | T | H | P | CNOT | T | H | P | |
| 8 | 243 | 266 | 76 | 0 | 94 | 56 | 28 | 12 | 0.006 |
| 16 | 547 | 602 | 172 | 0 | 206 | 120 | 60 | 28 | 0.018 |
| 32 | 1155 | 1274 | 364 | 0 | 430 | 248 | 124 | 60 | 0.066 |
| 64 | 2371 | 2618 | 748 | 0 | 878 | 504 | 252 | 124 | 0.598 |
| 128 | 4803 | 5306 | 1516 | 0 | 1774 | 1016 | 508 | 252 | 4.697 |
| 256 | 9667 | 10,682 | 3052 | 0 | 3566 | 2040 | 1020 | 508 | 34.431 |
| 512 | 19,395 | 21,434 | 6124 | 0 | 7150 | 4088 | 2044 | 1020 | 307.141 |
| 1024 | 38,851 | 42,938 | 12,268 | 0 | 14,318 | 8184 | 4092 | 2044 | 2446.336 |
| 2048 | 77,763 | 85,946 | 24,556 | 0 | 28,654 | 16,376 | 8,188 | 4092 | 23,886.841 |

FIG. 14

Table 3A: Optimization of product formula algorithms, showing the CNOT gate count reduction

| n | cnot counts for product formula algorithms | | | | | | | |
|---|---|---|---|---|---|---|---|---|
| | 1st order | | 2nd order | | 4th order | | 6th order | |
| | Before (x1000) | After (L) (x1000) | Before | After (L) | Before | After (L) | Before | After (L) |
| 10 | 9,600,024 | 9,600,024 | 49,622,280 | 33,081,540 | 82,152,000 | 54,768,000 | 833,073,000 | 555,382,020 |
| 20 | 307,200,192 | 307,200,192 | 793,971,040 | 529,047,400 | 927,468,000 | 618,312,040 | 8,376,270,000 | 5,584,180,040 |
| 30 | 2,332,800,648 | 2,332,800,648 | 4,016,805,120 | 2,677,870,140 | 3,830,076,000 | 2,553,384,060 | 22,322,240,000 | 21,548,180,060 |
| 40 | 9,830,401,536 | 9,830,401,536 | 12,694,063,680 | 8,462,709,200 | 10,477,257,600 | 6,984,838,480 | 84,262,560,000 | 56,175,040,080 |
| 50 | 30,000,003,000 | 30,000,003,000 | 30,989,866,200 | 20,659,910,980 | 22,869,948,000 | 15,246,632,100 | 177,187,560,000 | 118,125,040,100 |
| 60 | 74,649,605,184 | 74,649,605,184 | 64,258,513,920 | 42,839,009,400 | 43,278,861,600 | 28,852,574,520 | 325,230,480,000 | 216,820,320,120 |
| 70 | 161,347,208,232 | 161,347,208,232 | 119,044,086,080 | 79,362,724,140 | 74,215,289,400 | 49,476,859,740 | 543,505,116,000 | 362,336,744,140 |
| 80 | 314,572,812,288 | 314,572,812,288 | 203,080,443,680 | 135,386,962,720 | 118,409,788,800 | 78,939,859,360 | 843,991,544,000 | 562,327,696,160 |
| 90 | 566,870,417,496 | 566,870,417,496 | 325,291,230,720 | 216,860,820,680 | 178,795,738,800 | 119,197,159,380 | 1,255,450,374,000 | 836,966,916,180 |
| 100 | 960,000,024,000 | 960,000,024,000 | 495,789,866,400 | 330,526,577,800 | 288,496,092,000 | 172,330,728,200 | 1,783,255,700,000 | 1,188,903,800,200 |

FIG. 16A

Table 3B: Optimization of product formula algorithms, showing the Rz gate count reduction

| n | $R_z$ counts for product formula algorithms | | 2nd order | | 4th order | | 6th order | |
|---|---|---|---|---|---|---|---|---|
| | 1st order | | | | | | | |
| | Before (x1000) | After (L) (x1000) | Before | After (L) | Before | After (L) | Before | After (L) |
| 10 | 6,400,016 | 6,400,016 | 28,946,330 | 20,675,980 | 47,922,000 | 34,238,010 | 485,959,280 | 347,113,760 |
| 20 | 204,800,128 | 204,800,128 | 462,916,440 | 330,654,620 | 541,023,000 | 386,445,020 | 4,886,157,500 | 3,490,112,520 |
| 30 | 1,555,200,432 | 1,555,200,432 | 2,343,136,320 | 1,673,666,820 | 2,234,211,000 | 1,595,865,030 | 18,854,640,030 | 13,467,600,030 |
| 40 | 6,553,601,024 | 6,553,601,024 | 7,404,870,480 | 5,289,193,240 | 6,111,733,600 | 4,365,524,040 | 49,153,160,000 | 35,109,400,040 |
| 50 | 20,000,002,000 | 20,000,002,000 | 18,077,421,050 | 12,912,444,300 | 13,340,803,000 | 9,529,145,050 | 103,359,410,000 | 73,828,150,050 |
| 60 | 49,766,403,456 | 49,766,403,456 | 37,484,133,120 | 26,774,380,860 | 25,246,002,600 | 18,032,859,060 | 189,717,780,000 | 135,512,700,060 |
| 70 | 107,564,805,488 | 107,564,805,488 | 69,442,383,500 | 49,601,702,570 | 43,292,252,130 | 30,922,037,320 | 317,044,651,000 | 226,460,465,070 |
| 80 | 209,715,208,192 | 209,715,208,192 | 118,463,592,240 | 84,616,851,680 | 69,072,376,800 | 49,337,412,080 | 494,661,724,000 | 353,329,810,080 |
| 90 | 377,913,611,664 | 377,913,611,664 | 189,753,217,920 | 135,538,012,890 | 104,297,514,300 | 74,498,224,590 | 732,346,051,500 | 523,104,322,590 |
| 100 | 640,000,016,000 | 640,000,016,000 | 289,210,735,400 | 206,579,111,100 | 150,289,387,000 | 107,706,705,100 | 1,040,290,823,000 | 743,064,875,100 |

Table 4A: T-par comparison

| Circuit | Pre-optimization | | | Ref [ ] Post-optimization | | | | Our post-optimization (L) | | | | Our post-optimization (H) | | | |
|---|---|---|---|---|---|---|---|---|---|---|---|---|---|---|---|
| | Total | cnot | τ | Total | cnot | τ | t(s) | Total | cnot | τ | t(s) | Total | cnot | τ | t(s) |
| Mod $5_4$ | 63 | 28 | 28 | 76 | 48 | 16 | <0.001 | 51 | 28 | 16 | <0.001 | — | — | — | 0.001 |
| VBE-Adder$_3$ | 150 | 70 | 70 | 161 | 114 | 24 | 0.001 | 89 | 50 | 24 | <0.001 | — | — | — | 0.001 |
| CSLA-MUX$_3$ | 170 | 80 | 70 | 508 | 425 | 62ª | 0.001 | 161 | 70 | 64 | <0.001 | 155 | 70 | 64 | 0.009 |
| CSUM-MUX$_9$ | 420 | 168 | 196 | 593 | 411 | 112ᵇ | 0.005 | 294 | 168 | 84 | <0.001 | 266 | 140 | 84 | 0.009 |
| QCLA-Com$_7$ | 443 | 186 | 203 | 751 | 583 | 95 | 0.003 | 284 | 132 | 95 | 0.001 | — | — | — | 0.016 |
| QCLA-Mod$_7$ | 884 | 382 | 413 | 1572 | 1185 | 249 | 0.008 | 636 | 302 | 237 | 0.004 | 624 | 292 | 235 | 0.077 |
| QCLA-Adder$_{10}$ | 521 | 233 | 238 | 972 | 737 | 162 | 0.018 | 411 | 195 | 162 | 0.002 | 399 | 183 | 162 | 0.044 |
| Adder$_8$ | 900 | 409 | 399 | 1288 | 920 | 215 | 0.004 | 646 | 331 | 215 | 0.004 | 606 | 291 | 215 | 0.101 |
| RC-Adder$_6$ | 200 | 93 | 77 | 326 | 234 | 63 | 0.001 | 142 | 73 | 47 | <0.001 | 140 | 71 | 47 | 0.004 |
| Mod-Red$_{21}$ | 278 | 105 | 119 | 425 | 301 | 73 | 0.001 | 184 | 81 | 73 | <0.001 | 180 | 77 | 73 | 0.008 |
| Mod-Mult$_{55}$ | 119 | 48 | 49 | 223 | 166 | 37 | <0.001 | 91 | 40 | 35 | <0.001 | — | — | — | 0.002 |

FIG. 17A

| Table 4B: T-par comparison | | | | | | | | | | | | | |
|---|---|---|---|---|---|---|---|---|---|---|---|---|---|
| Circuit | Pre-optimization | | | Ref. Post-optimization | | | | Our post-optimization (L) | | | | Our post-optimization (H) | |
| | Total | CNOT | T | Total | CNOT | T | t(s) | Total | CNOT | T | t(s) | Total | CNOT | T | t(s) |
| Toff-Barenco₃ | 58 | 24 | 28 | 82 | 54 | 16 | <0.001 | 42 | 20 | 16 | <0.001 | 40 | 18 | 16 | 0.0001 |
| Toff-NC₃ | 45 | 18 | 21 | 65 | 41 | 15 | <0.001 | 35 | 14 | 15 | <0.001 | + | + | + | <0.0001 |
| Toff-Barenco₄ | 114 | 48 | 56 | 141 | 90 | 28 | <0.001 | 78 | 40 | 28 | <0.001 | 72 | 34 | 28 | 0.0001 |
| Toff-NC₄ | 75 | 30 | 35 | 102 | 63 | 23 | 0.001 | 55 | 22 | 23 | <0.001 | + | + | + | <0.0001 |
| Toff-Barenco₅ | 170 | 72 | 84 | 206 | 132 | 40 | <0.001 | 114 | 60 | 40 | <0.001 | 104 | 50 | 40 | 0.0003 |
| Toff-NC₅ | 105 | 42 | 49 | 148 | 94 | 31 | <0.001 | 75 | 30 | 31 | <0.001 | + | + | + | <0.0001 |
| Toff-Barenco₁₀ | 450 | 192 | 224 | 517 | 328 | 100 | 0.004 | 294 | 160 | 100 | 0.001 | 264 | 130 | 100 | 0.0012 |
| Toff-NC₁₀ | 255 | 102 | 119 | 361 | 232 | 71 | 0.002 | 175 | 70 | 71 | <0.001 | + | + | + | 0.0004 |

FIG. 17B

Table 4C: T-par comparison

| Circuit | Pre-optimization | | | Ref ☐ Post-optimization | | | | Our post-optimization (L) | | | | Our post-optimization (H) | | | |
|---|---|---|---|---|---|---|---|---|---|---|---|---|---|---|---|
| | Total | CNOT | T | Total | CNOT | T | t(s) | Total | CNOT | T | t(s) | Total | CNOT | T | t(s) |
| GF(2^4)-Mult | 225 | 99 | 112 | 419 | 324 | 68 | 0.0001 | 187 | 99 | 68 | 0.001 | -†- | -†- | -†- | 0.009 |
| GF(2^5)-Mult | 347 | 154 | 175 | 682 | 535 | 111 | 0.004 | 296 | 154 | 115 | 0.001 | -†- | -†- | -†- | 0.020 |
| GF(2^6)-Mult | 495 | 221 | 252 | 842 | 649 | 150 | 0.008 | 403 | 221 | 150 | 0.003 | -†- | -†- | -†- | 0.047 |
| GF(2^7)-Mult | 669 | 300 | 343 | 1245 | 992 | 217 | 0.031 | 555 | 300 | 217 | 0.004 | -†- | -†- | -†- | 0.105 |
| GF(2^8)-Mult | 883 | 405 | 448 | 1580 | 1256 | 264 | 0.052 | 712 | 405 | 264 | 0.006 | -†- | -†- | -†- | 0.192 |
| GF(2^9)-Mult | 1095 | 494 | 567 | 2096 | 1701 | 351 | 0.110 | 891 | 494 | 351 | 0.010 | -†- | -†- | -†- | 0.347 |
| GF(2^10)-Mult | 1347 | 609 | 700 | 2653 | 2176 | 410 | 0.227 | 1070 | 609 | 410 | 0.009 | -†- | -†- | -†- | 0.429 |
| GF(2^16)-Mult | 3435 | 1581 | 1792 | 7714 | 6592 | 1040 | 5.079 | 2707 | 1581 | 1040 | 0.065 | -†- | -†- | -†- | 5.566 |
| GF(2^32)-Mult | 13,562 | 6268 | 7168 | 37,583 | 33,269 | 4128 | 602.577 | 10,801 | 6268 | 4128 | 1.834 | -†- | -†- | -†- | 275.698 |
| GF(2^64)-Mult | 61,629 | 24,765 | 28,672 | 197,674 | 180,892 | 16,448 | 95,447,466 | 41,563 | 24,765 | 16,448 | 58.341 | | | | |
| GF(2^128)-Mult | 246,141 | 98,685 | 114,688 | N/A | N/A | N/A | N/A | 165,051 | 98,685 | 65,664 | 1744.746 | | | | |
| GF(2^131)-Mult | 258,085 | 103,616 | 120,127 | N/A | N/A | N/A | N/A | 173,370 | 103,616 | 69,037 | 1953.353 | | | | |
| GF(2^163)-Mult | 399,021 | 159,900 | 185,983 | N/A | N/A | N/A | N/A | 267,558 | 159,900 | 106,765 | 4955.927 | | | | |

AUTOMATED OPTIMIZATION OF LARGE-SCALE QUANTUM CIRCUITS WITH CONTINUOUS PARAMETERS

CROSS REFERENCE TO RELATED APPLICATIONS

The present application is a continuation application of U.S. patent application Ser. No. 16/164,586, filed Oct. 18, 2018, which claims priority to and the benefit of U.S. Provisional Patent Application No. 62/574,480, filed Oct. 19, 2017, both of which are entitled "AUTOMATED OPTIMIZATION OF LARGE-SCALE QUANTUM CIRCUITS WITH CONTINUOUS PARAMETERS." The contents of each application are hereby incorporated by reference in their entirety.

GOVERNMENT LICENSE RIGHTS

This invention was made with government support under W911NF1610349 awarded by the Army Research Office and CCF1526380 awarded by the National Science Foundation. The government has certain rights in the invention.

BACKGROUND OF THE DISCLOSURE

Aspects of the present disclosure generally relate to circuit optimization, and more specifically, to an automated optimization of large-scale quantum circuits with continuous parameters.

Large-scale quantum circuits may be implemented in different ways. The use of trapped atomic ions is one of the quantum information processing (QIP) approaches that has delivered universal and fully programmable quantum computing machines. Trapped atomic ions are also a leading platform for quantum information networks (QINs). Systems or networks based on trapped atomic ions that can improve the overall communications of such systems or networks are desirable.

It is therefore desirable to develop efficient techniques that allow for better optimization (e.g., smaller number of gates) of large-scale quantum circuits in various types of QIP systems, including QIP systems that are based on trapped atomic ions as well as those that are based on, for example, superconducting circuits.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

Described herein are techniques for automated optimization of large-scale quantum circuits with continuous parameters. For example, aspects of this disclosure describe the implementation of automated methods for optimizing quantum circuits of the size and type expected in quantum computations that outperform classical computers. The techniques described herein illustrate how to handle continuous gate parameters and can be applied to a collection of fast algorithms capable of optimizing large-scale quantum circuits. These techniques can provide better optimization in significantly less time than previous approaches, while making minimal structural changes so as to preserve the basic layout of the underlying quantum algorithms. The results provided by these techniques help bridge the gap between computations that can be run on existing quantum computing hardware and more advanced computations that are more challenging to implement in quantum computing hardware but are the ones that are expected to outperform what can be achieved with classical computers.

In an example, a method for optimizing quantum circuits is described that includes receiving a netlist containing information about a first list of quantum gates that form the quantum circuits; performing a phase-polynomial reduction operation on the information about the first list of quantum gates to produce a second list of quantum gates that has functional equivalence to the first list of quantum gates, a number of quantum gates in the second list of quantum gates being smaller than a number of quantum gates in the first list of quantum gates; generating a new netlist containing information about the second list of quantum gates; and providing the new netlist to implement a functionality of the quantum circuits using the second list of quantum gates.

BRIEF DESCRIPTION OF THE DRAWINGS

The appended drawings illustrate only some implementation and are therefore not to be considered limiting of scope.

FIG. 14 is a table that illustrates results for heavy optimization of Quipper library adder in accordance with aspects of this disclosure.

FIGS. 16A and 16B are tables that illustrate results for optimization of product formula algorithms in accordance with aspects of this disclosure.

FIGS. 17A-17C are tables that illustrate comparisons of T-par optimization with light and heavy optimization for different algorithms in accordance with aspects of this disclosure.

DETAILED DESCRIPTION

Figure 1:
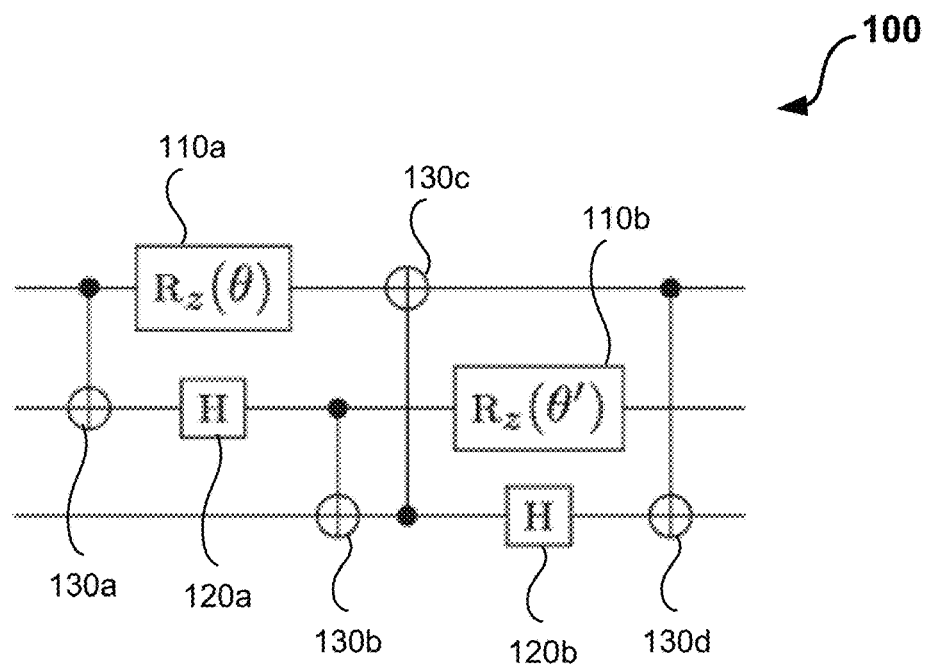
FIG. 1 is a diagram that illustrates an example of a quantum circuit in accordance with aspects of this disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

The disclosure describes the implementation of automated techniques for optimizing quantum circuits of the size and type expected in quantum computations that outperform classical computers. The disclosure shows how to handle continuous gate parameters and report a collection of fast algorithms capable of optimizing large-scale quantum circuits. For the suite of benchmarks considered, the techniques described can obtain substantial reductions in gate counts. In particular, the techniques in this disclosure provide better optimization in significantly less time than previous approaches, while making minimal structural changes so as to preserve the basic layout of the underlying quantum algorithms. The results provided by these techniques help bridge the gap between computations that can be run on existing quantum computing hardware and more advanced computations that are more challenging to implement in quantum computing hardware but are the ones that are expected to outperform what can be achieved with classical computers.

Introduction

Quantum computers or quantum information processing (QIP) systems have the potential to dramatically outperform classical computers at solving certain problems. Perhaps their best-known application is to the task of factoring integers: whereas the fastest known classical algorithm is superpolynomial, Shor's algorithm solves this problem in polynomial time, providing an attack on the widely-used RSA cryptosystem.

Even before the discovery of Shor's algorithm, quantum computers were proposed for simulating quantum mechanics. By simulating Hamiltonian dynamics, quantum computers can study phenomena in condensed matter and high-energy physics, quantum chemistry, and materials science. Useful instances of quantum simulation are likely accessible to smaller-scale quantum computers than classically-hard instances of the factoring problem.

These and other potential applications have helped motivate significant efforts toward building a scalable quantum computer. Two quantum computing technologies, superconducting circuits and trapped ions, have matured sufficiently to enable fully programmable universal devices, albeit currently of modest size. Several groups are actively developing these platforms into larger-scale devices, backed by significant investments from both industry and government. Thus, quantum computations involving tens or even hundreds of qubits are likely to be carried out in the not-too-distant future.

Experimental quantum information processing remains a difficult technical challenge, and the resources available for quantum computation will likely continue to be expensive and severely limited for some time. To make the most out of the available hardware, it is essential to develop implementations of quantum algorithms that are as efficient as possible (e.g., implemented with the fewest number of gates).

Quantum algorithms are typically expressed in terms of quantum circuits, which describe a computation as a sequence of elementary quantum logic gates acting on qubits. There are many ways of implementing a given algorithm with an available set of elementary operations, and it is advantageous to find an implementation that uses the fewest resources. While it is important to develop algorithms that are efficient in an abstract sense and to implement them with an eye toward practical efficiency, large-scale quantum circuits are likely to have sufficient complexity to benefit from techniques that enable automated optimization.

In this disclosure, various techniques are described that can be implemented as software tools (e.g., quantum circuit optimizer) for reducing the size of quantum circuits, aiming to improve their performance as much as possible at a scale where manual gate-level optimization is no longer practical. Since global optimization of arbitrary quantum circuits is QMA-hard, the approach described in this disclosure is to apply a set of carefully chosen heuristics in an automated fashion to reduce the gate counts, often resulting in substantial savings.

The optimization techniques described herein can be applied to several types of quantum circuits. Benchmark circuits include components of quantum algorithms for factoring and computing discrete logarithms, such as the quantum Fourier transform, integer adders, and Galois field multipliers. Also considered are circuits for the product formula approach to Hamiltonian simulation. In each of these cases, the focus is on circuit sizes that are likely to be useful in applications that outperform classical computation. The techniques described herein can help practitioners understand which implementation of an algorithm is most efficient in a given application.

While there is existing work on quantum circuit optimization, there is limited work that focuses on automated optimization techniques targeting large-scale circuits such as the ones considered here. Moreover, as described in more detail below, extrapolation of previously-reported runtimes suggests it is unlikely that existing quantum circuit optimizers would perform well for such large circuits. Direct comparisons between circuits optimized using the proposed techniques of this disclosure and other approaches show that the proposed techniques typically finds smaller circuits in less time. In addition, the proposed techniques of this disclosure are used for automated optimization of quantum circuits with continuous gate parameters.

General Discussion

In this disclosure, the problem of efficiently optimizing large-scale quantum circuits is considered, namely those quantum circuits appearing in quantum computations that are beyond the reach of classical computers. The disclosure describes two optimization approaches referred to as Light and Heavy optimization algorithms (e.g., Light version and Heavy version of the optimizer) that can be implemented and performed as software solutions (e.g., offline solutions to large-scale quantum circuit optimization). These algorithms are based on a chosen sequence of basic optimizations, yet they achieve substantial reductions in the gate counts, improving over more mathematically sophisticated approaches such as T-par optimization (described in more detail below). The simplicity of our approach is reflected in very fast runtimes, especially using the Light version of the optimizer.

The Heavy version of the optimizer demonstrates that even greater circuit optimization is possible. To further improve the output, it is possible to modify the routines for reducing $R_z$ count by implementing more extensive (and thus more computationally demanding) algorithms for composing stages of CNOT and $R_z$ gates, possibly with some Hadamard gates included. Another consideration is to incorporate template-based and peep-hole optimizations into the algorithms described herein. Another consideration is to expand the set of subcircuit rewriting rules (described in more detail below) and consider the performance of the approach on other benchmark circuits. Finally, considering the relative cost of different resources (e.g., different types of gates, ancilla qubits) could lead to optimizers that favorably trade off these resources.

Methods

Details regarding various optimization algorithms proposed in this disclosure and their implementation are described below. Throughout this disclosure the term g is used to denote the number of gates appearing in a circuit. The Background section below provides definition of notations used throughout this disclosure. The section titled Representations of quantum circuits describes three distinct representations of quantum circuits that can be employed in connection with the techniques described herein. In section titled Pre-processing, a pre-processing step is described that can be used with the various optimization algorithms described herein. In section titled Optimization subroutines, several subroutines are described that form the basic building blocks of the approach proposed in this disclosure. Moreover, the section titled General-purpose optimization algorithms explains how these subroutines are combined to form various versions of the optimization algorithms. Finally, in the section titled Special-purpose optimizations, two special-purpose optimization techniques are presented that can be used to handle particular types of circuits.

Background

A quantum circuit is a sequence of quantum gates acting on a collection of qubits. Quantum circuits are conveniently represented by diagrams in which horizontal wires denote time evolution of qubits, with time propagating from left to right, and boxes (or other symbols joining the wires) represent quantum gates. For example, the diagram 100 in FIG. 1 describes a simple three-qubit quantum circuit. The circuit in the diagram 100 includes two (2) single-qubit z-rotation gates (110a, 110b), $R_z(\theta)$ and $R_z(\theta')$, two (2) single-qubit Hadamard gates (120a, 120b), H, and four (4) two-qubit controlled-NOT gates (130a, 130b, 130c, and 130d), CNOTs.

A simple set of elementary gates is considered for quantum circuits consisting of the two-qubit CNOT gates, together with single-qubit NOT gate, single-qubit Hadamard gates, and single-qubit z-rotation gates as shown in the circuit in the diagram 100. Unitary matrices for these types of gates take expressions of the form:

$$\text{NOT} := \begin{pmatrix} 0 & 1 \\ 1 & 0 \end{pmatrix}, \quad (1)$$

$$H := \frac{1}{\sqrt{2}} \begin{pmatrix} 1 & 1 \\ 1 & -1 \end{pmatrix},$$

$$R_z(\theta) := \begin{pmatrix} e^{-i\theta/2} & 0 \\ 0 & e^{i\theta/2} \end{pmatrix}, \text{ and}$$

$$\text{CNOT} := \begin{pmatrix} 1 & 0 & 0 & 0 \\ 0 & 1 & 0 & 0 \\ 0 & 0 & 0 & 1 \\ 0 & 0 & 1 & 0 \end{pmatrix},$$

where $\theta \in (0, 2\pi]$ is the rotation angle. The phase gate P and the T gate can be obtained from $R_z(\theta)$ up to an undetectable global phase as $R_z(\pi/2)$ and $R_z(\pi/4)$, respectively. When the rotation angle is irrelevant, it is possible to denote a generic z-rotation by $R_z$.

Although the techniques described herein tend to produce quantum circuits over the set of H, $R_z$, NOT, and CNOT gates, input circuits that may include Toffoli gates can also be considered. The Toffoli gate (e.g., gate 1010a in a diagram 1000 in FIG. 10) is described by the mapping $|x, y, z\rangle \to |x, y, z \oplus (x \hat{} y)\rangle$ of the computational basis states. The Toffoli gates are also allowed to have negated controls. For example, the Toffoli gate with its top control negated (e.g., gate 1010b in the diagram 1000 in FIG. 10) acts as $|x, y, z\rangle \to |x, y, z \oplus (\bar{x} \hat{} y)\rangle$; and the Toffoli gate with both controls negated (e.g., gate 1010c in the diagram 1000 in FIG. 10) acts as $|x, y, z\rangle |x, y, z \oplus (\bar{x}) \bar{y})\rangle$.

The cost of performing a given quantum circuit depends on the physical system used to implement it. For example, there may be different cost considerations if the physical system is based on superconducting circuits or trapped atomic ions. The cost can also vary significantly between a physical-level (unprotected) implementation and a logical-level (fault-tolerant) implementation. At the physical level, a two-qubit gate is typically more expensive to implement than a single-qubit gate. The techniques described herein accommodate for this by considering the CNOT gate count and optimizing the number of the CNOT gates in the optimization algorithms.

For logical-level fault-tolerant circuits, the so-called Clifford operations (generated by the Hadamard, Phase, and CNOT gates) are often relatively easy to implement, whereas non-Clifford operations can incur significant overhead. Thus the number of $R_z$ gates are also considered in the optimization algorithms, which try to optimize their count. In fault-tolerant implementations, $R_z$ gates are approximated over a discrete gate set, typically consisting of Clifford and T gates. Optimal algorithms for producing such approximations are known. The number of Clifford+T gates required to approximate a generic $R_z$ gate depends primarily on the desired accuracy rather than the specific angle of rotation, so it is preferable to optimize a circuit before approximating its $R_z$ gates with Clifford+T fault-tolerant circuits.

By minimizing both the CNOT and $R_z$ counts, it is possible to perform optimizations targeting both physical- and logical-level implementations. Trade-offs between these two goals may be expected, and there are instances where such trade-offs do occur. However, in the techniques described herein only optimizations aimed at reducing both the $R_z$ and CNOT counts are considered.

Representations of Quantum Circuits

The following three representations of quantum circuits can be used in connection with the optimization techniques or optimization algorithms described herein:

First, a circuit can be stored as a list of gates to be applied sequentially (a netlist). It is sometimes convenient to specify the circuit in terms of subroutines (e.g., circuit subroutines), which can be referred to as blocks. Each block can be iterated any number of times and applied to any subset of the qubits present in the circuit. A representation using blocks can be especially concise since many quantum circuits exhibit a significant amount of repetition. A block is specified as a list of gates and qubit addresses.

The netlist representation can be input and output using a format produced by Quipper, a quantum programming language that is used to specify some of benchmark circuits. This format includes the ability to handle blocks. Other quantum programming languages and/or formats that have the same ability may also be used.

Second, a directed acyclic graph (DAG) representation can be used. The vertices of the DAG are the gates of the circuit and the edges encode their input/output relationships. The DAG representation has the advantage of making adjacency between gates easy to access.

Figure 2:
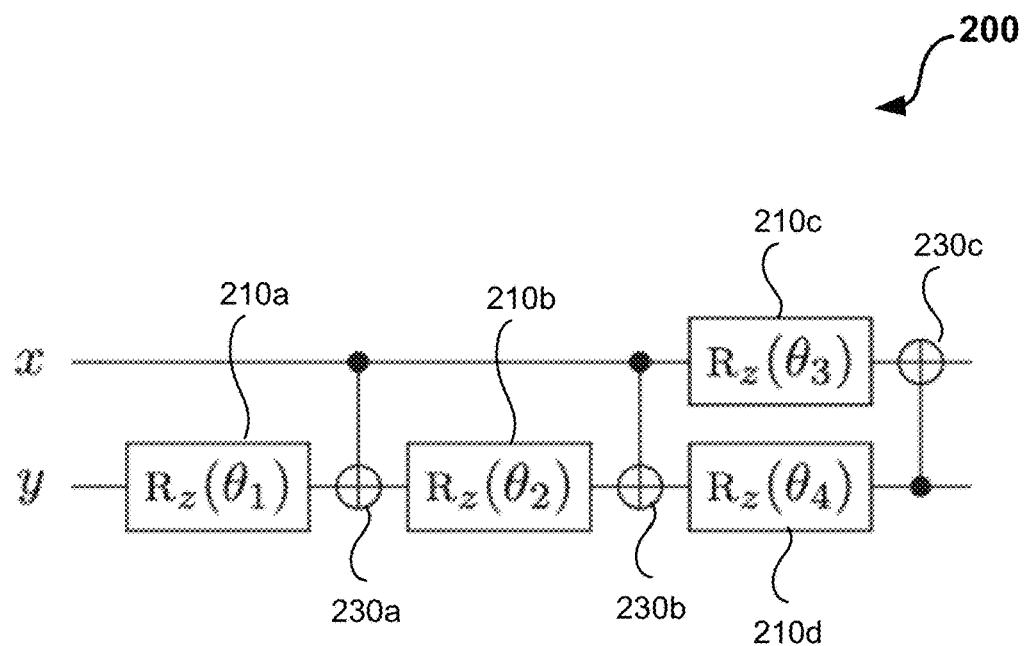
FIG. 2 is a diagram that illustrates an example of a quantum circuit for phase polynomial representation in accordance with aspects of this disclosure.

Third, a generalization of the phase polynomial representation of {NOT, CNOT, T} circuits can also be used. Unlike the netlist and DAG representations, this last representation applies only to circuits consisting entirely of NOT, CNOT, and $R_z$ gates. Such circuits can be concisely expressed as the composition of a linear Boolean transformation and a diagonal phase transformation. For example, let C be a circuit consisting only of CNOT gates and the gates $R_z(\theta_1)$, $R_z(\theta_2)$, ..., $R_z(\theta_l)$. Then the action of C on the n-qubit basis state $|x_1, x_2, \ldots, x_n\rangle$ has an expression of the form $$|x_1, x_2, \ldots, x_n\rangle \mapsto e^{ip(x_1, x_2, \ldots, x_n)} |h(x_1, x_2, \ldots, x_n)\rangle, \quad (2)$$

where h: $\{0,1\}^n \to \{0,1\}^n$ is a linear reversible function and $$p(x_1, x_2, \ldots, x_n) = \sum_{i=1}^{l} (\theta_i \bmod 2\pi) \cdot f_i(x_1, x_2, \ldots, x_n) \quad (3)$$

is a linear combination of affine Boolean functions $f_i$: $\{0,1\}^n \to \{0,1\}$ with the coefficients reduced modulo $2\pi$. The term $p(x_1, x_2, \ldots, x_n)$ is referred to as the phase polynomial associated with the circuit C. For example, the circuit shown in a diagram 200 in FIG. 2 having four (4) single-qubit z-rotation gates (210*a*, 210*b*, 210*c*, and 210*d*) and three (3) two-qubit CNOT gates (230*a*, 230*b*, and 230*c*), can be represented by the mapping expression:

$$|x,y\rangle \mapsto e^{ip(x,y)} |x \oplus y, y\rangle, \quad (4)$$

where $p(x, y) = \theta_1 y + \theta_2 (x \oplus y) + \theta_3 x + \theta_4 y$. In some instances, the phase polynomial representation may only be considered for {CNOT, T} circuits, so all $\theta_i$ in the expression (3) are integer multiples of $\pi/4$ and the functions $f_i$ are linear.

It is possible to convert between any two of the above three circuit representations in time linear in the number of gates in the circuit. Given a netlist, it is possible to build the corresponding DAG gate-by-gate. Conversely, it is possible to convert a DAG to a netlist by standard topological sorting. Conversion between the netlist and phase polynomial representations of {NOT, CNOT, $R_z$} circuits is possible by using, for example, a straightforward generalization described in connection with, for example, a meet-in-the middle algorithm used for fast synthesis of depth-optimal quantum circuits.

Pre-Processing

Before running the main optimization procedures (e.g., optimization algorithms), the circuit may be preprocessed to make it more amenable to further optimization. Since the optimizer can take, in addition to NOT, CNOT, and Toffoli gates, H and $R_z(\theta)$ gates, then the pre-processing can be applied to an input circuit consisting of NOT, CNOT, Toffoli, H, and/or $R_z(\theta)$ gates. Some examples are the Quipper adders and the T-par circuit benchmarks described in more detail below. For instance, the NOT gates can be pushed as far to the right as possible by commuting them through the controls of Toffoli gates and the targets of Toffoli and CNOT gates. When pushing a NOT gate through a Toffoli gate control, that control is negated (or the negation is removed if it was initially negated). If this procedure leads to a pair of adjacent NOT gates, the NOT gates can be removed from the circuit. If no such cancelation is found, the control negation changes may be reverted and the NOT gate may be moved back to its original position. Moreover, the commutation relation between the NOT gate and the H gate is such that NOT followed by H is H followed by a Z gate, where a Z gate is $R_z(\theta=\pi)$. Also, NOT followed by $R_z(\theta)$ is $R_z(-\theta)$ followed by NOT. Therefore, for the standard set of gates that consists of NOT, CNOT, Toffoli, H, and $R_z$ gates, together with the details described below in connection with reducing all affine functions of phases to linear functions by using NOT propagation through CNOT and $R_z$ gates, the NOT gates can be moved to the beginning or the end of a given circuit as part of the pre-processing step.

This NOT gate propagation leverages two aspects of the proposed optimizer or optimization algorithms. First, it is possible to accept Toffoli gates that may have negated controls and optimize their decomposition into Clifford+T circuits by exploiting freedom in the choice of T/T† polarities, as described in more detail below. Second, since cancelations of NOT gates simplify the phase polynomial representation (by making some of the functions $f_i$ in the phase polynomial representation (expression 3) linear instead of merely affine), such cancelations make it more likely that Subroutines 4 and 5 described below will find optimizations (since those subroutines rely on finding matching terms in the phase polynomial representation).

The complexity of this pre-processing step is O(g) since it is simply making a single pass through the circuit.

Optimization Subroutines

The optimization algorithms of this disclosure rely on a variety of subroutines that are described below in more detail. For each of them, the worst-case time complexity as a function of the number of gates g in the circuit is reported (for simplicity, the dependence on the number of qubits and other parameters is neglected). However, practical-case software runtime can be optimized by carefully ordering and restricting the subroutines, as discussed further below.

Subroutine 1—Hadamard Gate Reduction

Figure 3:
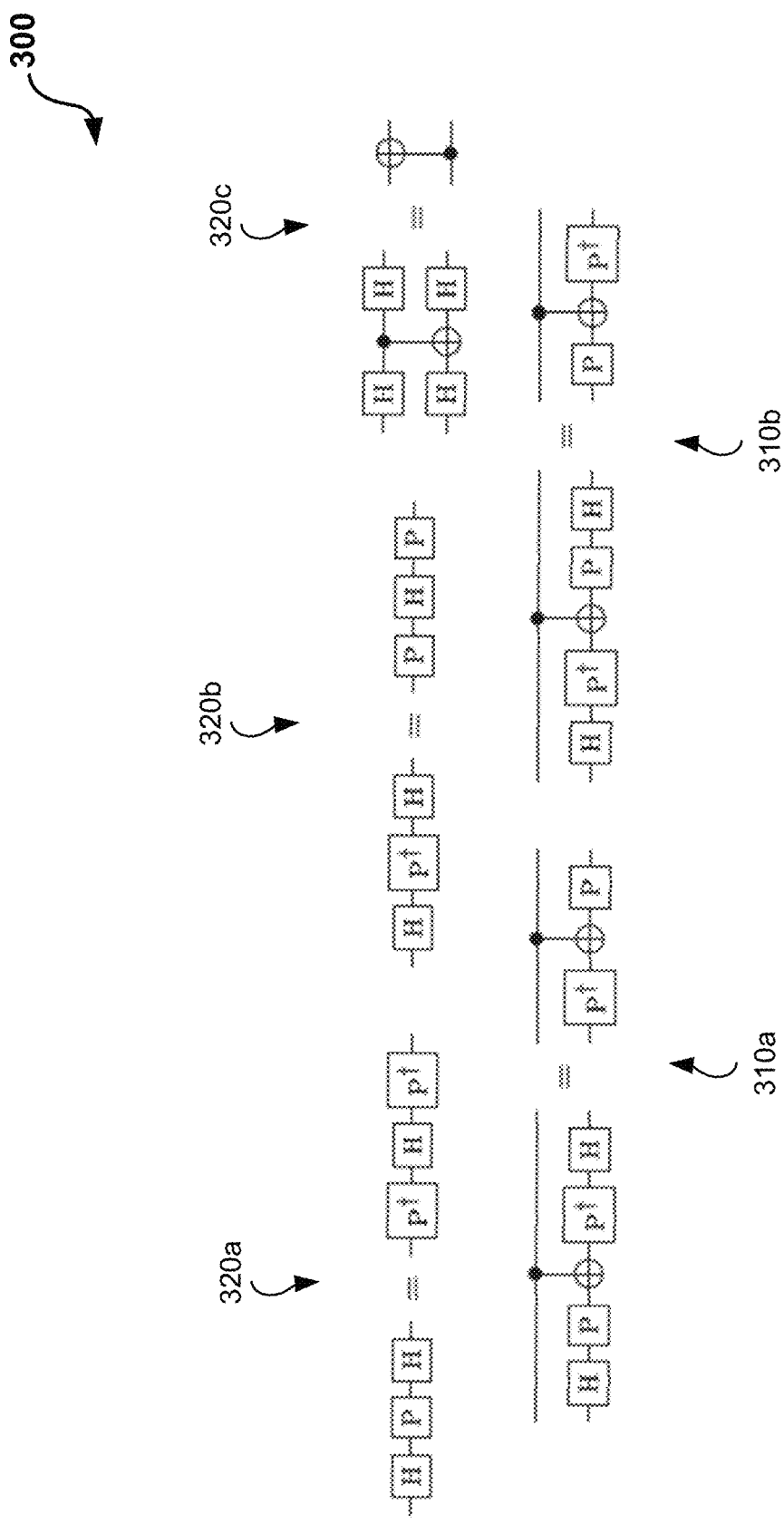
FIG. 3 is a diagram that illustrates examples of rules for Hadamard gate reduction in accordance with aspects of this disclosure.

Hadamard gates do not participate in phase polynomial optimization (Subroutines 4 and 5 below) and also tend to hinder gate commutation. Thus, the circuit identities or rules pictured in a diagram 300 in FIG. 3 are used to reduce the Hadamard gate count. The identities or rules include rules 310a and 310b at the bottom of the diagram 300 and rules 320a, 320b, and 320c at the top of the diagram 300. The rules 310a and 310b can be applied even if the middle CNOT gate is replaced by a circuit with arbitrarily many CNOT gates, provided that all of them share the target of the original CNOT gate.

Each application of these rules reduces the H count by up to 4. For a given Hadamard gate, the DAG representation can be used to check in constant time whether it is involved in one of these circuit identities. Thus, it is possible to implement this subroutine with complexity $O(g)$ by making a single pass through all Hadamard gates in the circuit.

Subroutine 2—Single-Qubit Gate Cancelation

Using the DAG representation of a quantum circuit, it is generally straightforward to determine whether a gate and its inverse are adjacent. If so, both gates can be removed to reduce the gate count. More generally, it is possible to cancel two single-qubit gates U and $U^\dagger$ that are separated by a subcircuit A that commutes with U. In general, deciding whether a gate U commutes with a circuit A may be computationally demanding. Instead, it is possible to apply a specific set of rules that provide sufficient (but not necessary) conditions for commutation. This approach is fast and appears to discover many commutations that can be exploited to simplify quantum circuits.

Figure 4:
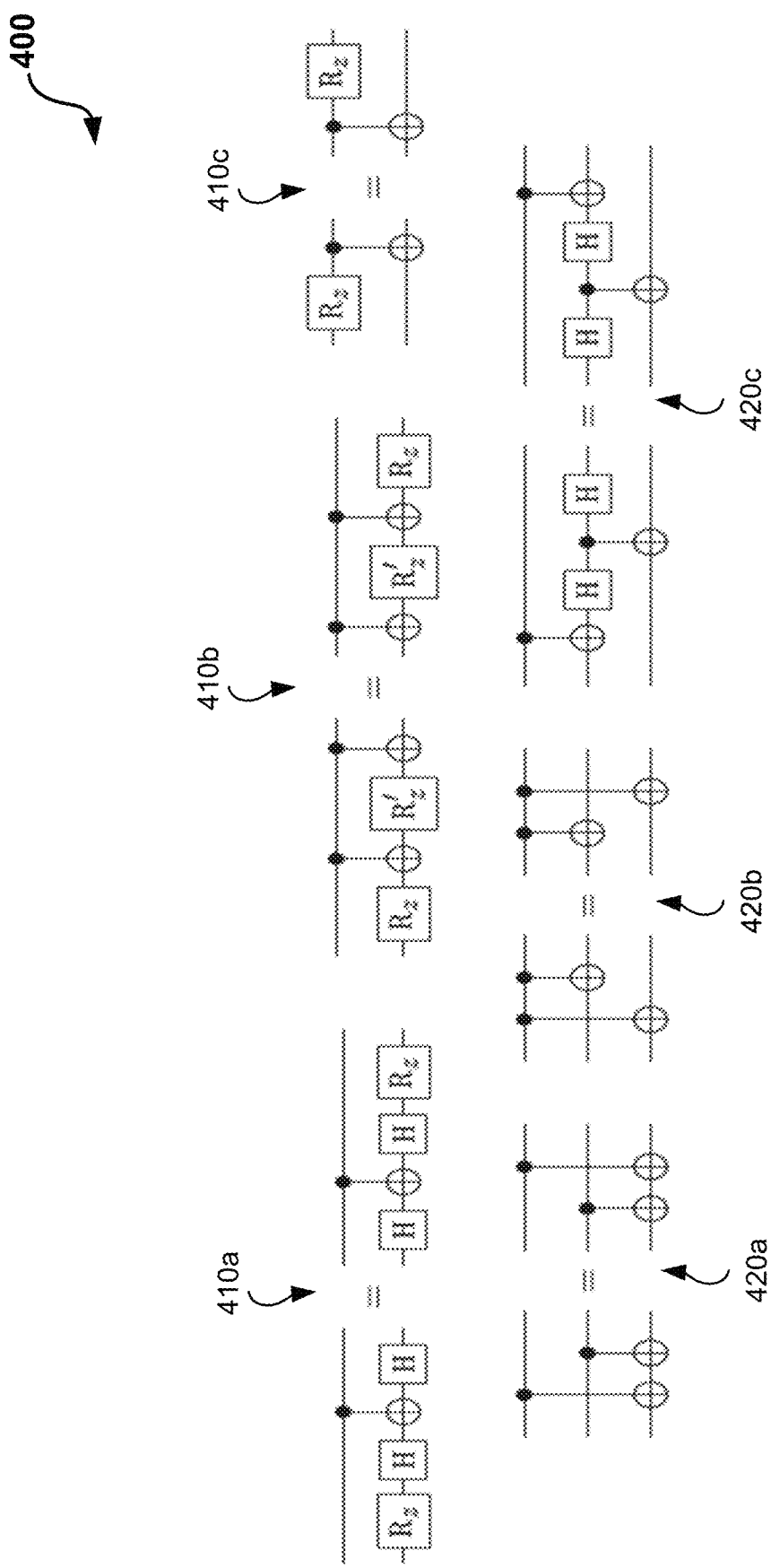
FIG. 4 is a diagram that illustrates examples of commutation rules in accordance with aspects of this disclosure.

Specifically, for each gate U in the circuit, the optimizer or optimization algorithms search for possible cancelations with some instance of $U^\dagger$. To do this, the approach is to repeatedly check whether U commutes through a set of consecutive gates, as evidenced by one of the patterns in a diagram 400 in FIG. 4. The diagram 400 includes commutation rules such as rules 410a, 410b, and 410c at the top for commuting an $R_z$ gate to the right, and rules 420a, 420b, and 420c for commuting a CNOT gate to the right. If at some stage it is not possible to move U to the right by some allowed commutation pattern, then cancelation of U with a matched $U^\dagger$ fails, and the initial configuration is restored. Otherwise, cancelation of U with some instance of $U^\dagger$ is successful. The commutation scheme described above need not be applied only with the specific direction to the right but may also be applied with the specific direction to the left.

For each of the g gates U, the subroutine checks whether it commutes through $O(g)$ subsequent positions. Thus the complexity of the overall gate cancelation rule is $O(g^2)$. The complexity could be made linear in g by only considering commutations through a constant number of subsequent gates, but this is not found to be necessary in practice.

A slight variation of this subroutine can be used to merge rotation gates, rather than cancel inverses. Specifically, two rotations $R_z(\theta_1)$ and $R_z(\theta_2)$ can be combined into a single rotation $R_z(\theta_1+\theta_2)$ to eliminate one $R_z$ gate.

Subroutine 3. Two-Qubit Gate Cancelation

This subroutine is analogous to subroutine 2, except that U is a two-qubit gate, which is generally CNOT in the circuits under consideration. Again, the complexity of this subroutine is $O(g^2)$, but may be reduced to $O(g)$ by imposing a maximal size for the subcircuit A.

Subroutine 4. Rotation Merging Using Phase Polynomials

In this case, a subcircuit consisting of the NOT, CNOT, and $R_z$ gates is considered. If two individual terms of its phase polynomial expression satisfy the expression $$f_i(x_1, x_2, \ldots, x_n) = f_j(x_1, x_2, \ldots, x_n) \quad (5)$$

for some $i \neq j$, then the corresponding rotations $R_z(\theta_i)$ and $R_z(\theta_j)$ can be merged. For example, in the circuit shown in the diagram 200 in FIG. 2, the first and fourth rotations are both applied to the qubit carrying the value y, as evidenced by its phase polynomial representation. Thus the circuit in the diagram 200 in FIG. 2 goes through the transformation shown in a diagram 500 in FIG. 5 in which the two rotations are combined. The transformed circuit to the right in the diagram 500 includes $R_z$ gates 510a, 510b, and 510c, where $R_z$ gate 510c has the two rotations combined, as well as CNOT gates 530a, 530b, and 530c.

In other words, the phase polynomial representation of circuits reveals when two rotations—in this case, $R_z(\theta_1)$ and $R_z(\theta_4)$—are applied to the same affine function of the inputs, even if they appear in different parts of the circuit. Then these rotations can be combined into a single rotation, improving the circuit. In this particular example, the simplification could have alternatively been obtained using the commutation techniques described above; however, that may not generally be the case. There is a flexibility to place the combined rotation at any point in the circuit where the relevant affine function appears. For concreteness, the combined rotation is placed at the first (leftmost) such location.

To apply Subroutine 4, a subcircuit consisting only of {NOT, CNOT, $R_z$} gates needs to be identified. This subcircuit is built one qubit at a time, starting from a designated CNOT gate. For the first qubit of this gate, the DAG representation is used to scan through all preceding and subsequent NOT, CNOT, and $R_z$ gates that act on this qubit, adding them to the subcircuit. When a Hadamard gate is encountered at the beginning or end of the circuit, a termination point is marked and exploring in that direction is stopped (so that each qubit has one beginning termination point and one ending termination point). For each CNOT gate between this qubit and some qubit that has not yet been encountered, an anchor point is marked where the gate acts on the newly-encountered qubit. This process is carried out with the second qubit acted on by the initial CNOT gate, and the process is repeated starting from every anchor point until no new qubits are encountered.

Figure 6:
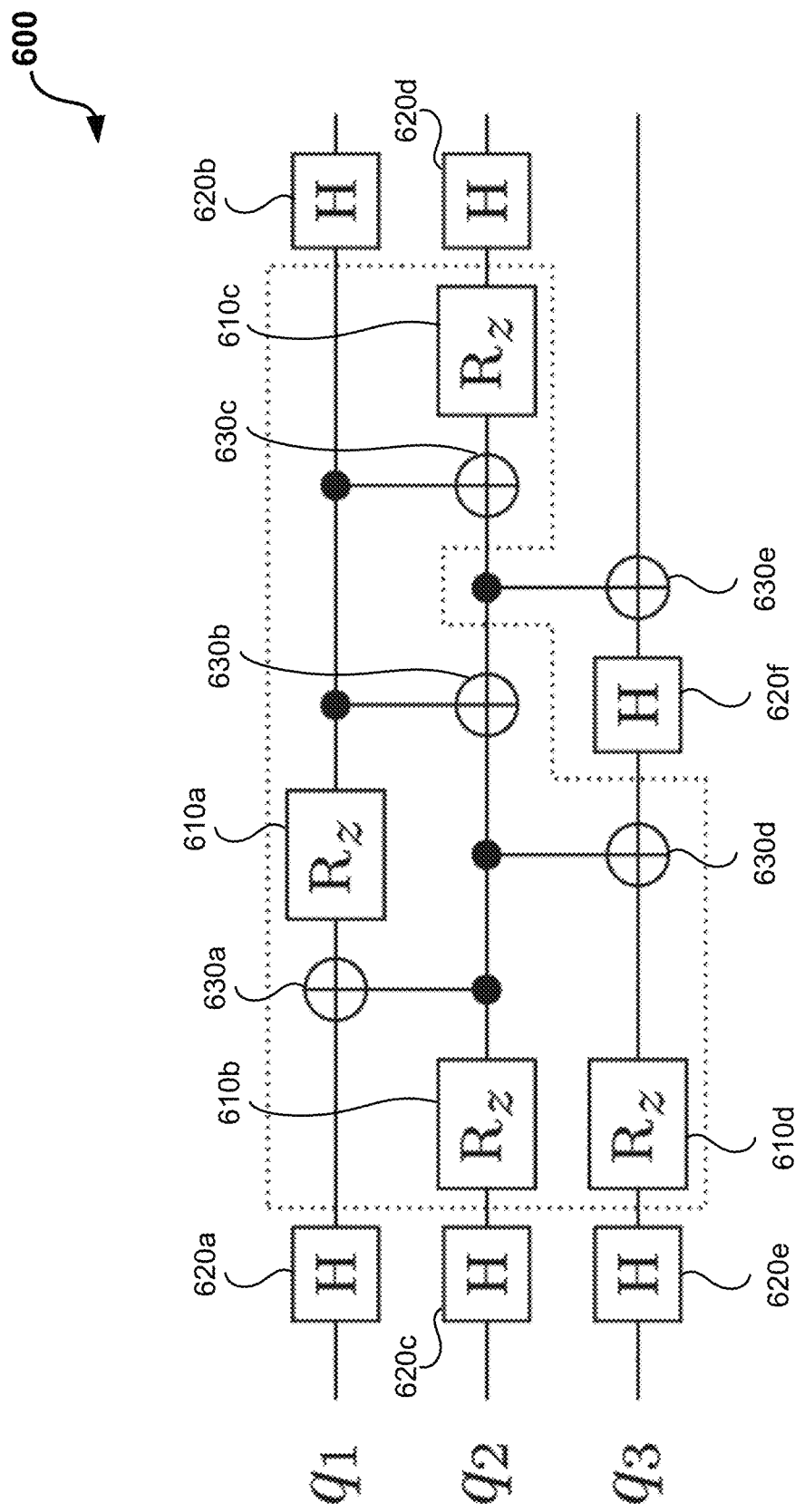
FIG. 6 is a diagram that illustrates a subcircuit amenable to phase polynomial representation in accordance with aspects of this disclosure.

While the resulting subcircuit consists only of NOT, CNOT, and $R_z$ gates, it may not have a polynomial phase representation—specifically, intermediate Hadamard gates on the wires that leave and re-enter the subcircuit can prevent this. To apply the phase polynomial formalism, it is necessary that this does not happen using the following pruning procedure. Starting with the designated initial CNOT gate, gates both before and after it in the netlist are successively considered until a termination point is encountered. Note that only CNOT gates need to be considered since every NOT and $R_z$ gate reached by this process can be included, as it does not prevent the phase polynomial expression from being applied. If both the control and target qubits of an encountered CNOT gate are within the termination border, then the procedure can continue. If the control qubit is outside the termination border but the target qubit is inside, the termination point of the target qubit is moved so that the CNOT gate being inspected falls outside the border, excluding it and any subsequent gates acting on its target qubit from the subcircuit. However, when the control is inside the border and the target is outside, an exception is made and the termination point is not moved (although the CNOT gate is not included in the subcircuit). This exception gives a larger {NOT, CNOT, $R_z$} subcircuit that remains amenable to phase polynomial representation, as illustrated in the example in a diagram 600 in FIG. 6.

In the example specified by the circuit in the diagram 600, it is possible to start the search from the first CNOT gate acting on the top ($q_1$) and middle ($q_2$) qubits (e.g., CNOT gate 630a). Traversing $q_1$ to the left, an H gate is found (e.g., H gate 620*a*), where a termination point is marked. Traversing $q_1$ to the right, two CNOT gates are found (e.g., CNOT gates 630*b*, 630*c*), one $R_z$ gate is found (e.g., $R_z$ gate 610*a*), and then an H gate is found (e.g., H gate 620*b*), where a termination point is marked. Neither of the encountered CNOT gates joins $q_1$ or $q_2$ to the remaining qubit $q_3$. The same procedure is repeated on $q_2$ from the original CNOT gate (e.g., CNOT gate 630*a*). To the left an $R_z$ gate is found (e.g., $R_z$ gate 610*b*) and then an H gate (e.g., H gate 620*c*), where a termination point is marked. Traversing to the right, a CNOT gate is found acting on $q_2$ and $q_3$ (e.g., CNOT gate 630*d*). This CNOT reveals additional connectivity, so an anchor point is marked on $q_3$ on the $q_3$ (target) side of this CNOT gate. Further to the right on the $q_2$ wire, there are three more CNOT gates (e.g., CNOT gates 630*b*, 630*e*, and 630*c*), none of which reveals additional connectivity, an $R_z$ gate (e.g., $R_z$ gate 610*c*), and finally an H gate (e.g., H gate 620*d*), where a termination point is marked. Next $q_3$ is examined by starting from the aforementioned anchor point. To the left, an H gate (e.g., H gate 620*e*) is found with no further connections to other qubits, and a termination point is marked. To the right, an H gate (e.g., H gate 6200 is immediately found and a termination point is marked.

Having built the subcircuit, next is to go through the netlist representation and to prune it. In this pass, the fourth CNOT gate acting on $q_2$ and $q_3$ is encountered (e.g., CNOT gate 630*e*), where the control is within the border of the subcircuit but the target is not. In this case the exception handling scheme described in the pruning procedure is applied. This ensures that the last CNOT gate in the {NOT, CNOT, $R_z$} region is included, while excluding the fourth CNOT gate (as indicated by the dashed border in the diagram 600). Thus the last $R_z$ gate appearing in the circuit can be relocated to the very beginning of the circuit on the $q_2$ line, to the right of the leftmost H, enabling a phase-polynomial based $R_z$ merge, as described in more detail below.

Once a valid {NOT, CNOT, $R_z$} subcircuit is identified, its phase polynomial can be generated. For each $R_z$ gate, it is possible to determine the associated affine function its phase is applied to and the location in the circuit where it is applied. The list of recorded affine functions is then sorted. Finally, it is possible to find and merge all $R_z$ gate repetitions, placing the merged $R_z$ at the first location in the subcircuit that computes the desired linear function.

This procedure considers $O(g)$ subcircuits, and the cost of processing each of these is dominated by sorting, with complexity $O(g \log g)$, giving an overall complexity of $O(g^2 \log g)$ for Subroutine 4. However, in practice the subcircuits are typically smaller when there are more of them to consider, so the true complexity is lower. In addition, when identifying a {NOT, CNOT, $R_z$} subcircuit, the process typically starts with a CNOT gate that has not yet been included in any of the previously-identified {NOT, CNOT, $R_z$} subcircuits, so the number of subcircuits can be much smaller than g in practice. If desired, the overall complexity can be lowered to $O(g)$ by limiting the maximal size of the subcircuit.

As a final step, it is possible to reduce all affine functions of phases to linear functions. This can be accomplished using NOT propagation through CNOT and $R_z$ gates as follows:

NOT($a$)CNOT($a$;$b$)↦ CNOT($a$;$b$)NOT($a$)NOT($b$);

NOT($b$)CNOT($a$;$b$)↦ CNOT($a$;$b$)NOT($b$);

NOT($a$)$R_z$($a$)↦ $R_z^\dagger$($a$)NOT($a$)

Applying this procedure ensures that each affine function $x_{i_1} \oplus x_{i_2} \oplus \ldots \oplus x_{i_k} \oplus 1$ transforms into the corresponding linear function $x_{i_1} \oplus x_{i_2} \oplus \ldots \oplus x_{i_k}$, thereby improving the chance to induce further phase collisions.

Subroutine 5—Floating $R_z$ gates

In Subroutine 4, the affine functions associated with $R_z$ gates are tracked. More generally, all affine functions that occur in the subcircuit and their respective locations are recorded, regardless of the presence of $R_z$ gates. Thus it is possible to identify all possible locations where an $R_z$ gate could be placed, not just those locations where $R_z$ gates already appear in the circuit. In this "floating" $R_z$ gate placement picture, three optimization sub-subroutines can be employed: two-qubit gate cancelations, gate count preserving rewriting rules, and gate count reducing rewriting rules.

The first of these sub-subroutines is essentially identical to Subroutine 4, except that $R_z$ gates are now floatable and the focus is on a specific identified subcircuit. This approach allows to place the $R_z$ gates so as to facilitate cancelations by keeping track of all possible $R_z$ gate locations along the way. In particular, if not placing an $R_z$ gate at a particular location will allow two CNOT gates to cancel, that location is simply removed from the list of possible locations for the $R_z$ gate and the CNOT cancelation is performed instead.

Figure 7:
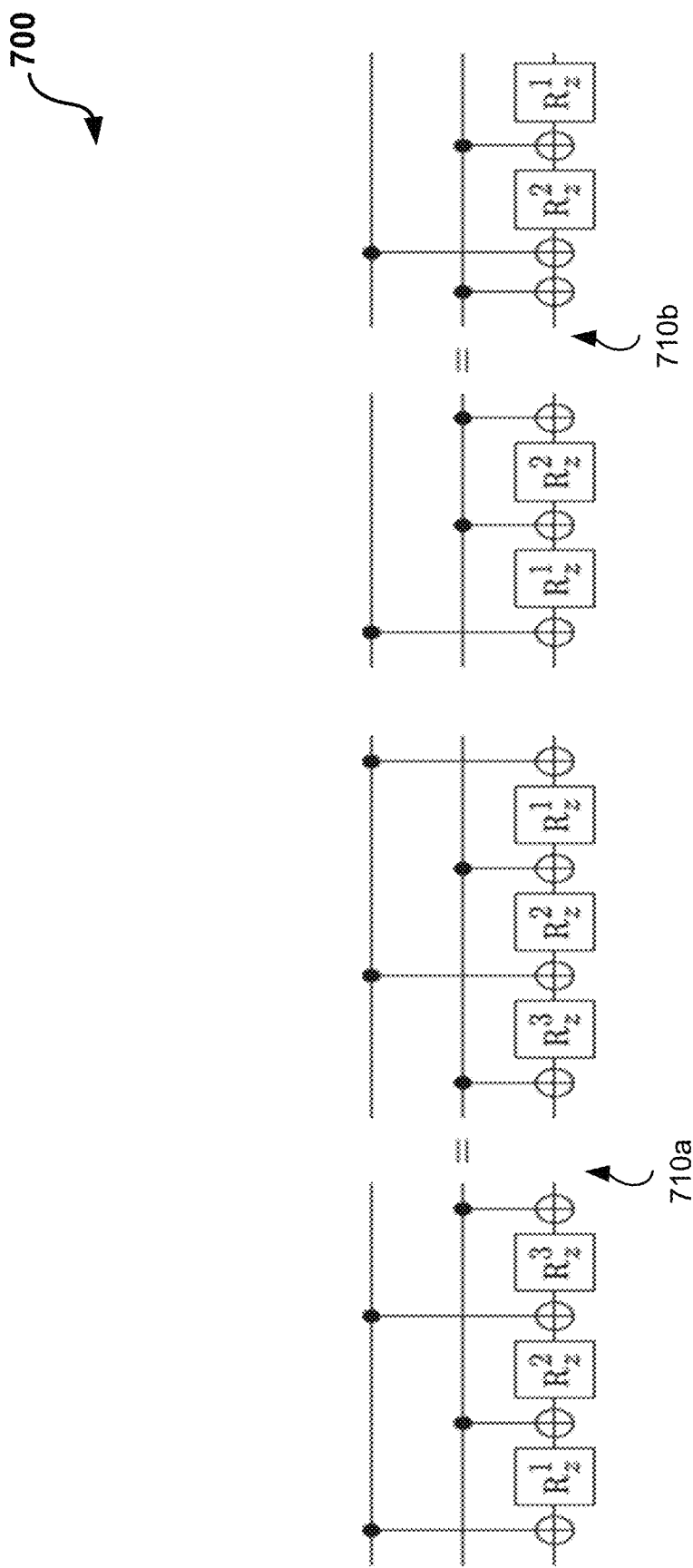
FIG. 7 is a diagram that illustrates examples of gate count preserving rewriting rules in accordance with aspects of this disclosure.

Next rewriting rules are applied that preserve the gate count (see e.g., a diagram 700 in FIG. 7) in an attempt to find further optimizations. For example, the diagram 700 includes gate count preserving rules 710*a* and 710*b*. While these replacements do not eliminate gates, they modify the circuit in ways that can enable optimizations elsewhere. The rewriting rules are provided by an external library file, and subcircuits are identified to which they can be applied using the DAG representation. The replacements are applied only if they lead to a reduction in the two-qubit gate count through one more round of the aforementioned two-qubit cancelation subroutine with floatable $R_z$ gates. Note that the rewriting rules may be applicable only with certain floating $R_z$ gates at particular locations in a circuit. This subroutine uses floating $R_z$ gates to choose those combinations of $R_z$ gate locations that lead to reduction in the gate count.

Figure 8:
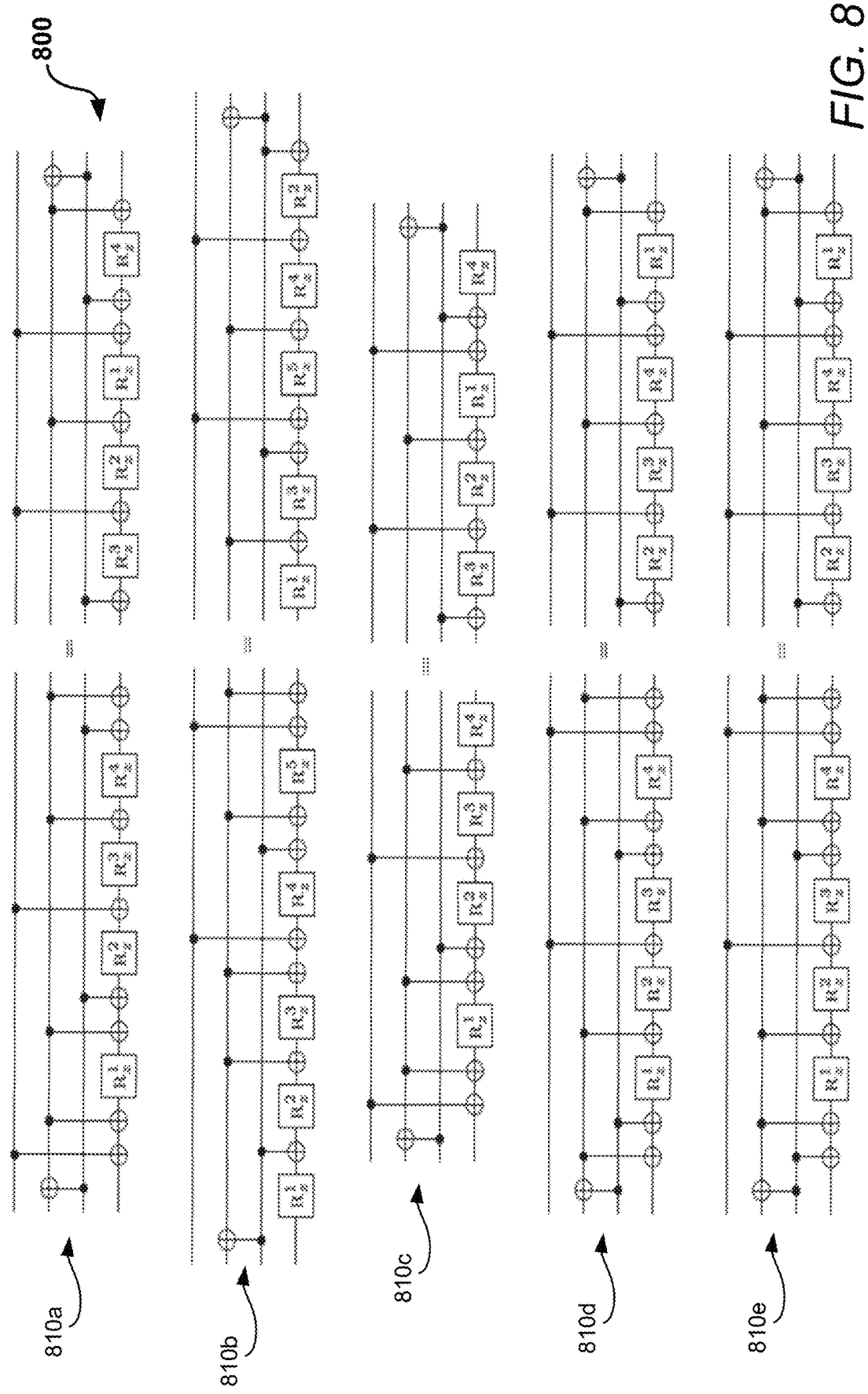
FIG. 8 is a diagram that illustrates examples of gate count reducing rewriting rules in accordance with aspects of this disclosure.

The last sub-subroutine applies rewriting rules that reduce the gate count (see e.g., a diagram 800 in FIG. 8 for gate count reducing rewriting rules employed in Subroutine 5). The diagram 800 includes gate count reducing rewriting rules 810*a*, 810*b*, 810*c*, 810*d*, and 810*e*. These rules can also be provided via an external library file. Since these rules reduce the gate count on their own, the rewriting is generally performed whenever a suitable pattern is found. The complexity of this three-step subroutine (i.e., the three optimization sub-subroutines in Subroutine 5) is upper bounded by $O(g^3)$ since the number of subcircuits is $O(g)$, and within each subcircuit, the two-qubit cancelation (Subroutine 3) has complexity $O(g^2)$. The rewriting rules (e.g., the gate count preserving rewriting rules in FIG. 7, the gate count reducing rewriting rules in FIG. 8) can be applied with complexity $O(g)$ since, as in Subroutine 1, a single pass through the gates in the circuit suffices. Again, in practice, the number of subcircuits and the subcircuit sizes are typically inversely related, which lowers the observed complexity by about a factor of g. The complexity can be lowered to $O(g^2)$ by limiting the maximal size of the subcircuit. Indeed, the complexity can be further lowered to $O(g \log g)$ by limiting the maximal size of the subcircuit A in the two-qubit gate cancelation (the sorting could still have complexity $O(g \log g)$).

Figure 5:
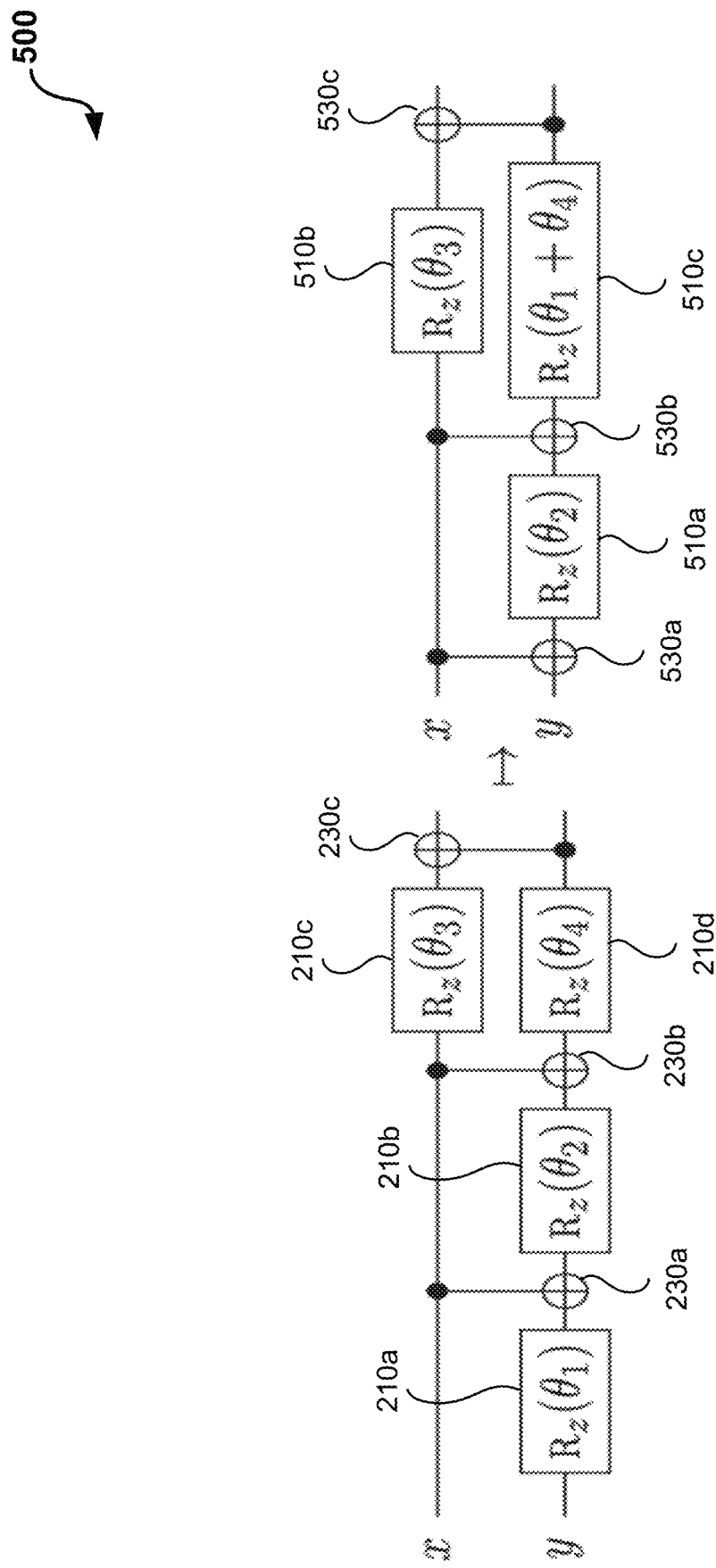
FIG. 5 is a diagram that illustrates an example of an optimization subroutine with rotation merging using phase polynomials in accordance with aspects of this disclosure.
Figure 9:
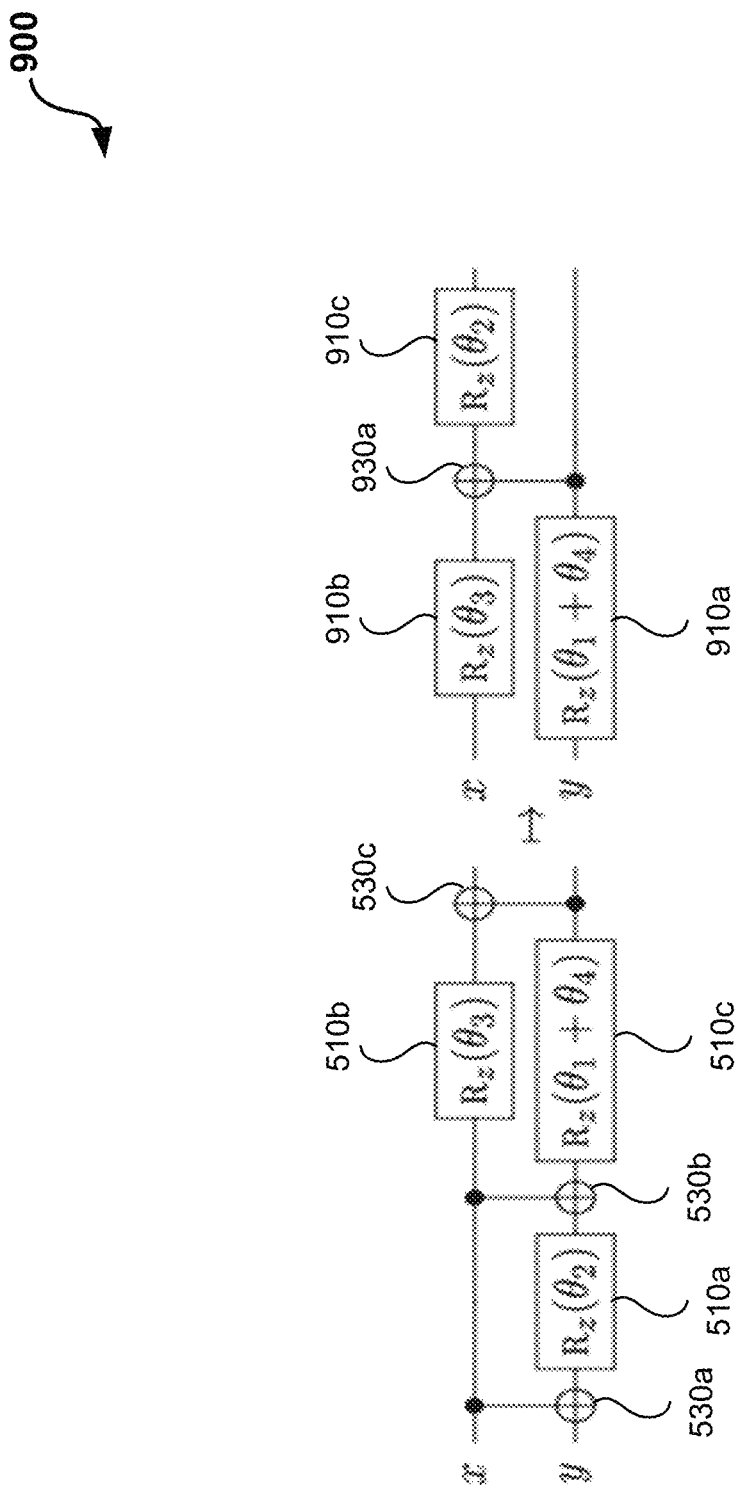
FIG. 9 is a diagram that illustrates an example of further simplification of the circuit in FIG. 5 in accordance with aspects of this disclosure.

To illustrate an example of how this optimization works, consider the circuit on the right-hand side in the diagram 500 in FIG. 5. Observe that $R_z(\theta_2)$ (e.g., gate 510a) may be executed on the top qubit at the end of the circuit, allowing the first two CNOTs to cancel, leading to the optimized circuit illustrated on the right-hand side in a diagram 900 in FIG. 9, which is simplified even further by including three (3) $R_z$ gates 910a, 910b, and 910c, and a single CNOT gate 930a.

General-Purpose Optimization Algorithms

The optimization algorithms or techniques described in this disclosure simply apply the various subroutines described above in a carefully chosen order. There are two versions of the optimizer or optimization algorithms that are referred to as a Light version (or simply Light) and a Heavy version (or simply Heavy). In general, the Heavy version applies more subroutines, yielding better optimization results at the cost of a higher runtime. The pre-processing step can be used in both Light and Heavy versions of the optimizer.

The Light version of the optimizer applies the optimization subroutines in the following sequence or order:

1, 3, 2, 3, 1, 2, 4, 3, 2.

This sequence is then repeated until no further optimization is achieved. This sequence is at least partially based on the principle that first exposing {CNOT, $R_z$} gates while reducing Hadamard gates (Subroutine 1) allows for a greater reduction in the cancelation routines (Subroutines 3, 2, 3), and in particular frees up two-qubit CNOT gates to facilitate single-qubit gate reductions and vice versa. Applying the replacement rule (Subroutine 1) may enable more reductions after the first four optimization subroutines. Additional single-qubit gate cancelation and merging is then sought (Subroutine 2). This enables faster identification of the {NOT, CNOT, $R_z$} subcircuit regions to look for further $R_z$ count optimizations (Subroutine 4), after which the process checks for residual cancelations of the gates (Subroutines 3, 2).

The Heavy version of the optimizer applies the following sequence or order:

1, 3, 2, 3, 1, 2, 5.

Similarly, this sequence is repeated until no further optimization is achieved. The first six steps in the optimization sequence of the Heavy version of the optimizer are identical to that of the Light version of the optimizer. The difference is that in the Heavy version of the optimizer the approach used takes advantage of floating $R_z$ gates (Subroutine 5), allowing locations for the $R_z$ gates that admit better CNOT gate reductions to be found, including the use of gate count preserving rewriting rules to expose further gate cancelations and gate count reducing rewriting rules to remove any remaining inefficiency.

The orders or sequences described above are provided by way of illustration and other orders or sequences can also be used in which more or fewer of the subroutines described above are involved.

It is to be noted that the computational overhead incurred due to the circuit representation conversion tends to be minimal. All conversions can be done in time linear in the circuit size (see e.g., section titled Representations of quantum circuits for detail). Representations are kept consistent only as necessary. In Subroutine 1—Subroutine 3, individual gates can be accessed using the DAG representation to quickly find reductions. This allows the update of only the DAG representation to record gate count reductions before continuing with the optimization process. In Subroutine 4 and Subroutine 5, both representations can be updated concurrently on the fly whenever a reduction is found, keeping both the DAG and netlist representations consistent. This is useful since both routines identify subcircuits that are amenable to reductions using the phase polynomial representation. The identification process requires an up-to-date DAG representation and creating the phase polynomial representation requires an up-to-date netlist representation. Note that the phase polynomial representation is employed only to aid optimization in the identified subcircuit; it is not necessary to convert the phase polynomial representation back to either the netlist or the DAG representation. The phase polynomial representation may thus be safely purged when the corresponding subcircuit optimization process is finished.

Special-Purpose Optimizations

In addition to the general-purpose optimizer described above (e.g., general-purpose optimization algorithms), two specialized optimizations can be employed to improve circuits with particular structures.

$\mathcal{LCR}$ optimizer: Some quantum algorithms—such as product formula simulation algorithms—involve repeating a fixed block multiple times. To optimize such a circuit, it may be best to first run the optimizer on a single block to obtain its optimized version, $\mathcal{O}$. To find simplifications across multiple blocks, the circuit $\mathcal{O}^2$ can be optimized and the result can be called $\mathcal{LR}$, where $\mathcal{L}$ is the maximal prefix of $\mathcal{O}$ in the optimization of $\mathcal{O}^2$. The next step is to optimize $\mathcal{O}^3$. Provided optimizations only occur near the boundaries between blocks, it is possible to remove the prefix $\mathcal{L}$ and the suffix $\mathcal{C}$ from the optimized version of $\mathcal{O}^3$, and call the remaining circuit $\mathcal{C}$. Assuming that such $\mathcal{L}$, $\mathcal{C}$, and $\mathcal{R}$ can be found (which is typically the case in practice), then it is possible to simplify $\mathcal{O}^t$ to $\mathcal{LC}^{t-2}\mathcal{R}$.

Toffoli decomposition: Many quantum algorithms are naturally described using Toffoli gates. The optimizer or optimization algorithms described in this disclosure can handle Toffoli gates with both positive and negative controls. Since the goal is to express circuits with respect to the gate set {NOT, CNOT, H, $R_z$}, the Toffoli gate is decomposed in terms of these elementary gates. The techniques described herein take advantage of different ways of doing this to improve the quality of optimization.

Figure 10:
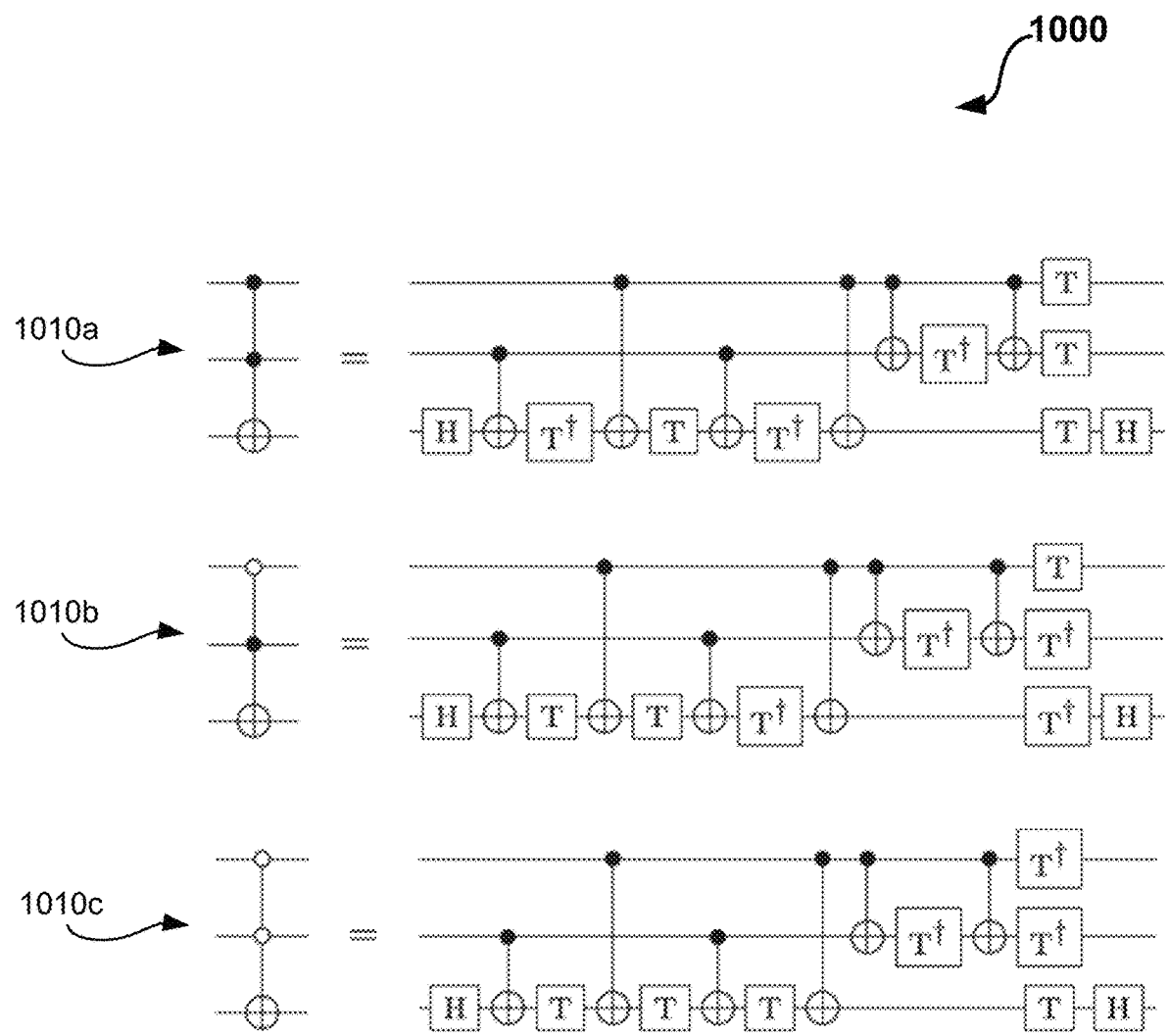
FIG. 10 is a diagram that illustrates examples of Toffoli gate implementations in accordance with aspects of this disclosure.

Specifically, the Toffoli gates can be expanded in terms of one- and two-qubit gates using the identities shown in the diagram 1000 in FIG. 10, keeping in mind that it is also possible to obtain the desired Toffoli gate by exchanging T and $T^\dagger$ in those circuit decompositions (because the Toffoli gate is self-inverse). As described above, the identities in the diagram 1000 include the Toffoli gate 1010a, the Toffoli gate with top control negated 1010b, and the Toffoli gate with both controls negated 1010c. Initially, the optimizer leaves the polarity of $T/T^\dagger$ gates (i.e., the choice of which gates include the dagger and which do not) in each Toffoli decomposition undetermined. The optimizer symbolically processes the indeterminate T and $T^\dagger$ gates by simply moving their locations in a given quantum circuit, keeping track of their relative polarities. The optimization is considered complete when movements of the indeterminate T and $T^\dagger$ gates cannot further reduce the gate count. Finally, it is possible to choose the polarities of each Toffoli gate (subject to the fixed relationships between them) with the goal of minimizing the T count in the optimized circuit. This minimization is performed in a greedy way, choosing polarities for each Toffoli gate in the order of the appearance of the associated $T/T^\dagger$ gates in the nearly-optimized circuit, so as to reduce the T count as much as possible.

Overall, this polarity selection process takes time O(g). After selecting polarities, it is possible to run Subroutine 3 and Subroutine 2, since particular choices of polarities may lead to further cancelations of the CNOT gates and single-qubit gates that were otherwise not possible due to the presence of the indeterminate gates blocking the desired commutations.

Optimization Results

An example implementation of aspects of the optimizer or optimization algorithms described herein has been made using the Fortran programming language and tested it using three sets of benchmark circuits. All results shown in this disclosure were obtained using a machine with a 2.9 GHz Intel Core i5 processor and 8 GB of 1867 MHz DDR3 memory, running OS X El Capitan. It is to be understood that the results are provided by way of illustration and to show relative performance, and that the results may vary when performed using different hardware configurations.

As part of the testing various quantum circuits that include components of Shor's integer factoring algorithm were considered, namely the quantum Fourier transform (QFT) and the integer adders. Also considered were quantum circuits for the product formula approach to Hamiltonian simulation (PF). In both cases, the focus of the testing was on quantum circuit with sizes likely to be useful in applications that outperform classical computation, and ran experiments with different types of adders and product formulas. Finally, a set of benchmark quantum circuits were also considered, consisting of various arithmetic circuits (including a family of Galois field multipliers) and implementations of multiple control Toffoli gates. Data files describing these circuits before and after optimization are available for comparison.

Correctness of the optimizer or optimization algorithms was checked by verifying the functional equivalence (i.e., equality of the corresponding unitary matrices) of various test circuits before and after optimization. Such a test is generally feasible for circuits with a small number of qubits. These tests were performed for all 8-qubit benchmarks in Table 1 shown in a diagram 1300 in FIG. 13 and Table 2 shown in a diagram 1400 in FIG. 14. Table 1 includes light optimization of adder circuits with the results for an in-place adder based on the QFT (or QFA) on top and for a Quipper library adder at the bottom. These tests were also performed for all 10-qubit benchmarks in Tables 3A and 3B shown in diagrams 1600a and 1600b in FIGS. 16A and 16B, respectively. Table 3A shows optimization of product formula algorithms with CNOT gate reduction and Table 3B shows optimization of product formula algorithms with $R_z$ gate reduction. Software runtimes range from 0.004 s (1st order, n=10) to 0.137 s (6th order, n=100). The Clifford gate reduction ranges from 62.5% for Hadamard and 75% for Phase gates (for the 1st order formula, independent of n) to 75% for Hadamard and 85% for Phase gates (for the 6th order formula, again independent of n). The notation "(×1000)" indicates that the gate counts for the 1st order formula are in units of thousands (no rounding errors). The notation "(L)" denotes the standard Light version of the optimization as described above.

In addition, Tables 4A-4C shown in diagrams 1700a-1700c in FIGS. 17A-17C represent the results of the optimizer in comparison with following benchmarks: Mod 54, VBE-Adder$_3$, CSLA-MUX$_3$, RC-Adder$_6$, Mod-Red$_{21}$, Mod-Mult$_{55}$, Toff-Barenco$_{3\ldots 5}$, Toff-NC$_{3\ldots 5}$, GF($2^4$)-Mult, and GF($2^5$)-Mult. For example, Tables 4A-4C include T-par comparisons (described in more detail below), where the names of the benchmark algorithms are as generally known except that Toff-Barenco and Toff-NC are used to denote implementations of multiply-controlled Toffoli gates. The notation "(L)" denotes the standard Light version of the optimization, while the notation "(H)" denotes the standard Heavy version of the optimization. The symbol -||- indicates that there was no improvement in the Heavy version of the optimization over the Light version of the optimization.

QFT and Adders

The QFT is a fundamental subroutine in quantum computation, appearing in many quantum algorithms with exponential speedup. The standard circuit for the exact n-qubit QFT uses $R_z$ gates, some with angles that are exponentially small in n. It is well understood that one can perform a highly-accurate approximate QFT by omitting gates with very small rotation angles. For the purposes of the optimizer or optimization algorithms of this disclosure, rotations by angles at most $\pi/2^{13}$ may be omitted, which ensures sufficient accuracy of the approximate QFT for quantum circuits of the sizes under consideration. These small rotations are removed before optimization so that their omission does not contribute to the improvements reported in the results.

Figure 11:
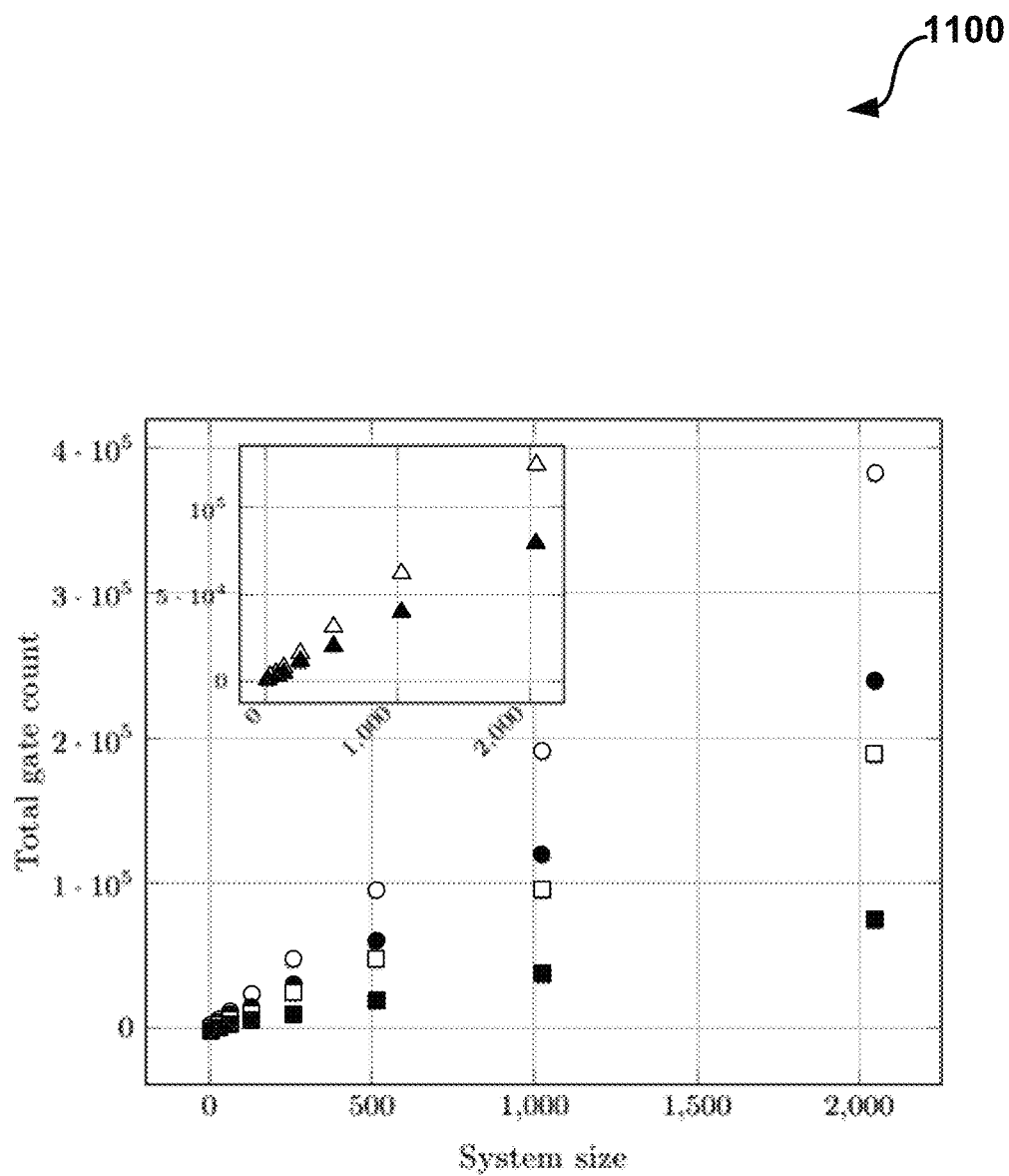
FIG. 11 is a chart that illustrates examples of total gate counts for the approximate quantum Fourier transform (QFT), Quipper library adder, and Fourier-based adders (QFA) in accordance with aspects of this disclosure.

In the chart shown in a diagram 1100 in FIG. 11, shows the total gate count for the approximate quantum Fourier transform (QFT, inset), Quipper library adder, and Fourier-based adders (QFA). The symbols in white/black represent gate counts before/after optimization and the square/circle/triangle symbols represent gate counts for the Quipper library adder/QFA/QFT, respectively. A savings ratio of larger than 36% is observed for the QFT with 512 or more qubits. The optimization comes entirely from the reduction in the number of $R_z$ gates, the most expensive resource in a fault-tolerant implementation.

As shown in the chart in the diagram 1100 in FIG. 11, two types of integer adders are considered: an in-place modulo $2^q$ adder as implemented in the Quipper library and an in-place adder based on the QFT (or QFA). The QFA circuits use an approximate QFT in which the rotations by angles less than $\pi/2^{13}$ are removed, as described above. Adders are a basic component of Shor's quantum algorithm for integer factoring. The results shown report gate counts before and after optimization for the Quipper adders and the QFAs for circuits acting on $2^L$ qubits, with L ranging from 4 to 11. Adders with L=10, for example, are used in Shor's integer factoring algorithm for factoring 1,024-bit numbers. The related RSA-1024 challenge remains unsolved.

Figure 13:
FIG. 13 is a table that illustrates results for light optimization of adder circuits in accordance with aspects of this disclosure.

The results of Light (version) optimization of the adder circuits are shown in FIGS. 11 and 13. For the Quipper library adders, the full Light optimizer is used. For the QFA optimization, a modified Light optimizer is used instead with the sequence of subroutines 1, 3, 2, 3, 1, 2, omitting the final three subroutines 4, 3, 2 of the standard Light optimizer. This was done as no additional gate savings was found from those subroutines in small instances (n≤256).

The simplified Quipper library adder outperforms the QFA by a wide margin, suggesting that it may be preferred in practice. For the Quipper library adder, a reduction in the T gate count by a factor of up to 5.2 is observed. This reduction is obtained entirely by automated means (i.e., by the optimization algorithms), without using any prior knowledge of the circuit structure. Since Shor's integer factoring algorithm is dominated by the cost of modular exponentiation, which in turn relies primarily on integer addition, this optimization reduces the cost of executing the overall factoring algorithm by a factor of more than 5.

Figure 12:
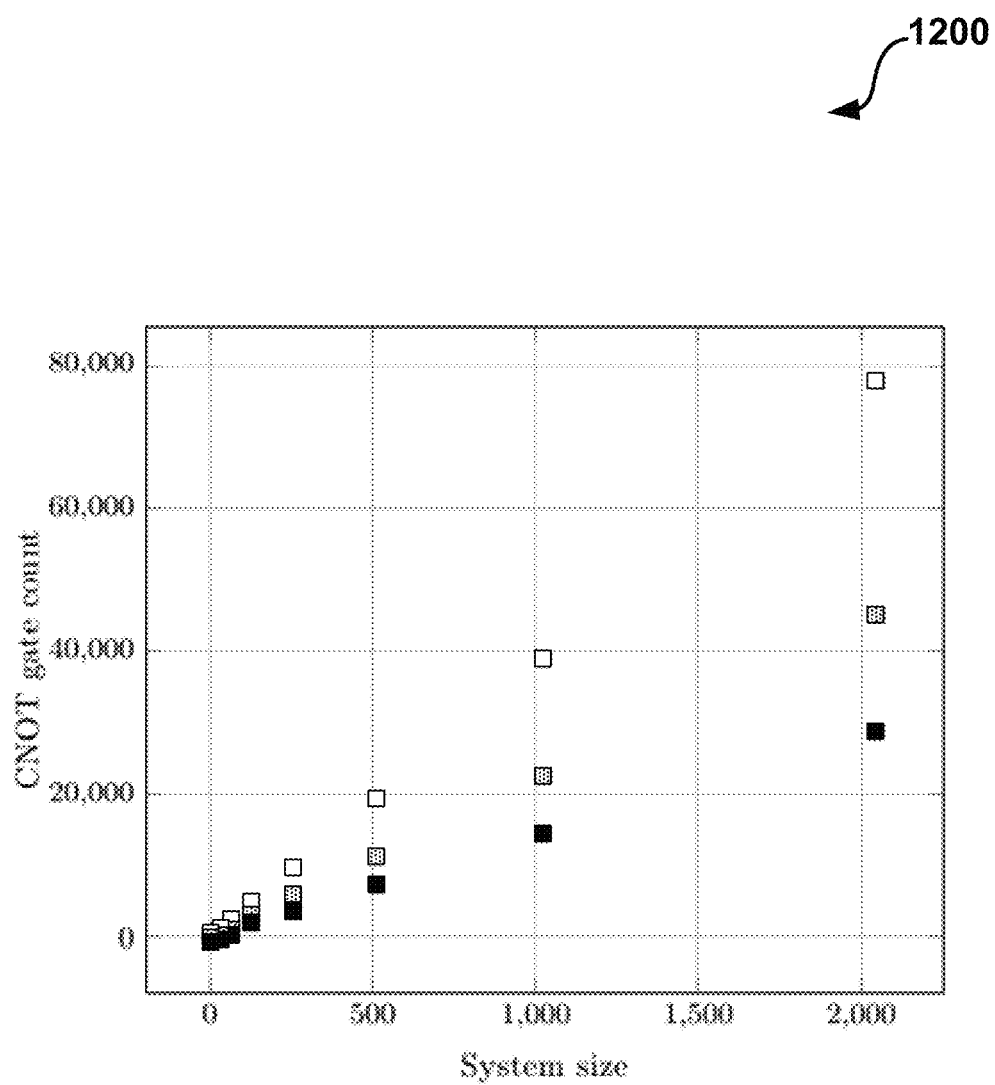
FIG. 12 is a chart that illustrates examples of numbers of CNOT gates for Quipper library adders in accordance with aspects of this disclosure.

The Heavy optimizer was also applied to the QFT and adder circuits. For the QFT and QFA circuits, the Heavy setting does not improve the gate counts. The results of the Heavy optimization for the Quipper adder are shown in Table 2 in the diagram 1400 in FIG. 14. A reduction in the CNOT count by a factor of 2.7 is found compared to a factor of only 1.7 for the Light optimization. A chart in a diagram 1200 in FIG. 12 illustrates the total CNOT counts of the Quipper library adder before optimization (e.g., pre-optimization), after Light optimization, and after Heavy optimization, showing the reduction in the CNOT count by the two types of optimization. The square symbols in white/dot patterned/black represent the gate counts in pre-optimization/post-Light optimization/post-Heavy optimization, respectively.

Quantum Simulation

A first explicit polynomial-time quantum algorithm for simulating Hamiltonian dynamics has been introduced and the approach was later generalized to higher-order product formulas (PFs), resulting in improved asymptotic complexities. This disclosure reports gate counts before and after optimization for the PF algorithms of orders 1, 2, 4, and 6 (for orders higher than 1, the order of the standard Suzuki product-formula construction is even). For concreteness, these algorithms are implemented for a one-dimensional Heisenberg model in a magnetic field with periodic boundary conditions, evolving the system for the time proportional to its size, and the algorithm parameters are chosen to ensure the Hamiltonian simulation error is at most $10^{-3}$ using known bounds on the error of the product formula approximation.

Figure 15:
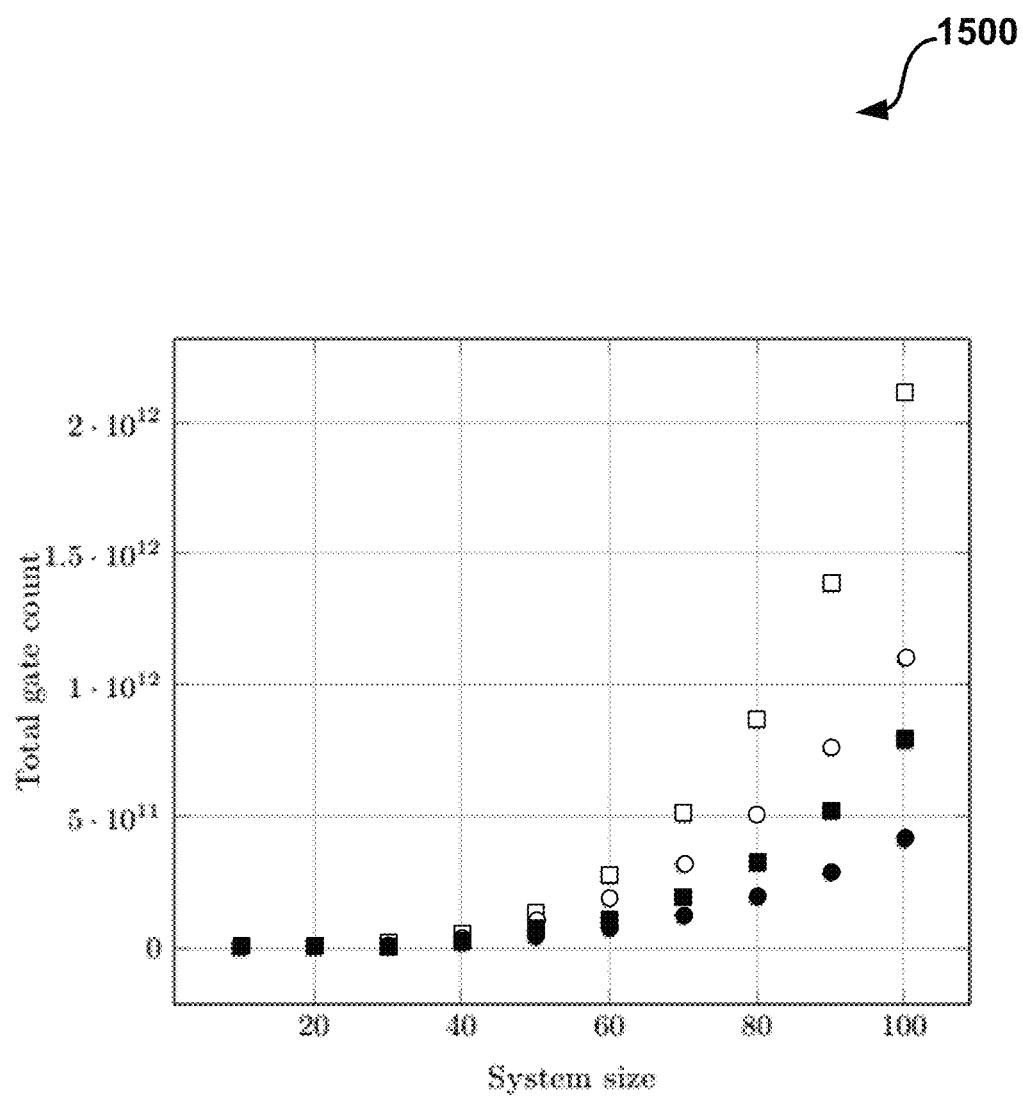
FIG. 15 is a chart that illustrates examples of total gate counts for product formula algorithms in accordance with aspects of this disclosure.

The results of Light optimization of product formula algorithms are reported in Tables 3A and 3B (e.g., FIGS. 16A and 16B) and illustrated in a chart in a diagram 1500 in FIG. 15, where the symbols in white/black represent gate counts before/after optimization and the square/circle symbols represent gate counts for the second-/fourth-order formula, respectively. For these product formula algorithms, the Heavy optimization does not offer a further improvement over the Light optimization. The 2nd-, 4th-, and 6th-order algorithms admit a ~33.3% reduction in the CNOT count and a ~28.5% reduction in the $R_z$ count, roughly corresponding to the reductions relevant to physical-level and logical-level implementations. The 1st-order formula algorithm did not exhibit CNOT or $R_z$ gate optimization. In all product formula algorithms, the number of Phase and Hadamard gates reduced significantly, by a factor of roughly 3 to 6.

Comparison with Other Approaches

Quantum circuit optimization is a known field. However, prior work on circuit optimization has not considered large-scale quantum circuits of the kind that could outperform classical computers as considered in this disclosure. For instance, in the work by Amy, Maslov, and Mosca ("Polynomial-time T-depth optimization of Clifford+T circuits via matroid partitioning," *IEEE Trans. Comput. Aided Des. Integr. Circuits Syst.*, vol. 33, pages 1476-1489 (2014)), the complexity of optimizing a g-gate circuit is $O(g^3)$, making optimization of large-scale circuits unrealistic. There are examples of running times ranging from 0.07 to 1.883 seconds for numbers of qubits from n=10 to 35 and gate counts from 60 to 368, whereas the optimization algorithms described herein ran for a comparable time when optimizing the Quipper adders up to n=256 with around 23,000 gates, as shown in Table 1 (FIG. 13). There also are other examples of quantum circuit optimization based on peep-hole optimization using optimal gate libraries, which are expensive by taking in some cases more than 100 seconds for a 20-qubit, 1,000-gate circuit.

To compare the results produced by using the optimization algorithms proposed in this disclosure to those reported previously, a weighted combination of T and CNOT counts is considered. While the T gate can be considerably more expensive to implement fault-tolerantly using state distillation, neglecting the cost of the CNOT gates may lead to a significant underestimate. Some analysis suggest that a fault-tolerant T gate may be 46 to 350 times more expensive to implement than a local fault-tolerant CNOT gate, with at least one recommendation regarding the cost ratio being 1:50. The true overhead depends on many details, including the fault tolerance scheme, the error model, the size of the computation, architectural restrictions, the extent to which the implementation of the T gate can be optimized, and whether T state production happens offline so its cost can be (partially) discounted. For a rough comparison, one approach is to work with an aggregate cost metric defined as follows: #T+0.01·log n·#CNOT, where #T is the number of T gates used, 0.01 accounts for the relative efficiency of the CNOT gate relative to the T gate, n is the number of qubits in the computation, and #CNOT is the number of CNOT gates used. Here the factor of log n underestimates the typical cost of performing gates between qubits in a realistic architecture (whereas the true cost may be closer to $$\sqrt[3]{n}$$

in three dimensions or $\sqrt{n}$ in two dimensions). Since the approaches described herein preserve the structure of the original circuit, this metric should give a conservative comparison with other approaches (such as the T-par approach mentioned below) that may introduce long-range gates. Therefore, showing advantage with respect to this aggregate cost can very crudely demonstrate the benefits of the proposed optimization techniques described in this disclosure.

Results from using the techniques described in this disclosure can be compared directly with the results reported by Amy, Maslov, and Mosca, which aim to reduce the T count and T depth using techniques based on matroid partitioning. That approach is what is referred to in this disclosure as T-par. Results from using the techniques described in this disclosure are used to optimize a set of benchmark circuits appearing in that work and the results are compared with the T-par optimization, as shown in Tables 4A-4C (FIGS. 17A-17C).

The benchmark circuits fall into three categories. The first set (Table 4A in FIG. 17A) consists of a selection of arithmetic operations. For these circuits, better or matching T counts are obtained compared to the benchmarks while also obtaining much better CNOT counts. Note that the circuit CSLA-MUX$_3$ is excluded from the comparison since it is believed T-par optimized it incorrectly. To illustrate the advantage of the optimization techniques described herein, using the aggregate cost metric described above the proposed techniques reduced the cost of the RC-Adder$_6$ circuit from 71.91 to 49.70. The improvement in cost is thus by about 31%, mostly due to a reduced T gate count.

The second set of benchmarks consists of multiply-controlled Toffoli gates (Table 4B in FIG. 17B). While the proposed optimizer matched the T count obtained by the T-par optimizer and substantially reduced the CNOT count, neither the proposed optimizer nor the previous approaches could find the best known implementations. This is not surprising, given the very different circuit structure employed in the best known implementations.

The third set of benchmarks contains Galois field multiplier circuits (Table 4C in FIG. 17C). In an example, the Heavy optimizer is terminated when its runtime exceeds that of the light optimizer by a factor of 200. Such a timeout occurred when applying the Heavy optimizer to the four largest instances of the Galois field multiplier circuits. There was no advantage from the Heavy optimizer over the Light optimizer in the cases tested, so the Heavy optimizer was not applied to the four largest instances (the corresponding entries are left blank in Table 4C). The T count again matches that of the T-par optimizer, but the CNOT count is much lower, resulting in the circuits that are clearly preferred. For example, the optimized $GF(2^{64})$ multiplier circuit has been shown to use 180,892 CNOT gates, whereas the optimized implementation resulting from the techniques of this disclosure uses only 24,765 CNOT gates; the aggregate cost is thus reduced from 30,168.59 to 18,326.42 despite no change in the T count, that is, by about 39%. The reduction comes mostly or solely from the CNOT gates. This comparison demonstrates that the discrepancy between T count and realistic aggregate cost estimate predicted in theory is manifested in practice. The efficiency of the Light optimizer allowed the optimization of the $GF(2^{131})$ and $GF(2^{163})$ multiplier quantum circuits, corresponding to instances of the elliptic curve discrete logarithm problem that remain unsolved. Given the reported T-par optimization runtimes, an instance of this size appears to be intractable for the T-par optimizer.

A new tool for T count optimization have been proposed (e.g., by Heyfron and Campbell). The approach used in this new tool relies on measurement and classical feedback, in contrast to the fully unitary circuits considered in this disclosure. Moreover, this new tool does not provide CNOT counts, making it impossible to give a direct comparison that accounts for both T and CNOT gates. Again, this new tool solely targets T count optimization, whereas the techniques of this disclosure departed from this simple costing metric. For example, an optimized $QFT_4$ circuit based on this new T count optimization tool implements a 4-qubit QFT transformation using 44 qubits, suggesting that the CNOT gate overhead must be large. A further significant difference is scalability: while the techniques described herein are suitable for and applied to optimize large circuits, the new T count optimization tool only treats very small circuits—for instance, the largest GF multiplier optimized by that tool is the 7-bit case, whereas the techniques described herein can tackle GF multipliers with 131 and 163 bits, corresponding to unsolved Certicom challenges. Another difference is that the techniques proposed herein use only those qubit-to-qubit interactions already available in the input circuits. This enables executing optimized circuits in the same architecture as the input circuit, which may be useful for quantum computers over restricted architectures. In contrast, the new T count optimization tool introduces new interactions. Finally, the techniques proposed herein can handle circuits with arbitrary $R_z$ gates, whereas the new T count optimization tool is limited to Clifford+T circuits.

Overall Performance

Examples of numerical optimization results produced by the optimization algorithms described in this disclosure are presented in Table 1, Table 2, Tables 3A and 3B, and Tables 4A-4C. These tables contain benchmarks relevant to practical quantum computations that are beyond the reach of classical computers. In Table 1 and Table 2 these are the 1,024- and 2,048-qubit QFT and integer adders used in classically-intractable instances of Shor's factoring algorithm. In Tables 3A and 3B these include all instances with n≥50, for which direct classical simulation of quantum dynamics is currently infeasible. In Tables 4A-4C these are Galois field multipliers over binary fields of sizes 131 and 163, which are relevant to quantum attacks on unsolved Certicom ECC Challenge problems. This illustrates that the proposed optimizer or optimization algorithms are capable of handling quantum circuits that are sufficiently large to be practically relevant.

The proposed optimizer or optimization algorithms can be applied more generally than previous work on circuit optimization. It readily accepts composite gates, such as Toffoli gates (which may have negated controls). It also handles gates with continuous parameters, a useful feature for algorithms that naturally use $R_z$ gates, including Hamiltonian simulation and factoring. Many quantum information processing technologies natively support such gates, including both trapped ions and superconducting circuits, so that the proposed approach described herein may be useful for optimizing physical-level circuits.

Fault-tolerant quantum computations generally rely on a discrete gate set, such as Clifford+T, and optimal Clifford+T implementations of $R_z$ gates are already known. Nevertheless, the ability to optimize circuits with continuous parameters is also valuable in the fault-tolerant setting. This is because optimizing with respect to a natural continuously-parametrized gate set before compiling into a discrete fault-tolerant set will likely result in smaller final circuits.

Finally, unlike previous approaches, the proposed optimizer of this disclosure is configured to preserve the structure of the original quantum circuit. In particular, the set of two-qubit interactions that are used by the optimized quantum circuit is a subset of those used in the original quantum circuit. This holds because neither the pre-processing step nor the optimization algorithms introduce any new two-qubit gates. By keeping the types of interactions used under control (in stark contrast to, for example, T-par, which dramatically increases the set of interactions used), the optimized implementations resulting from the proposed optimization algorithms are better suited for architectures with limited connectivity. In particular, given a layout of the original quantum circuit on hardware with limited connectivity, this property allows use the same layout for the optimized quantum circuit. Moreover, unlike other optimization tools (e.g., the new T count optimization tool described above), the proposed optimizer of this disclosure does not increase the number of the CNOT gates used. This can be of relevant practical consideration since a long-range CNOT gate can be even more expensive than a T gate, and focusing on T optimization alone may result in circuits whose cost is dominated by CNOT gates.

Figure 18:
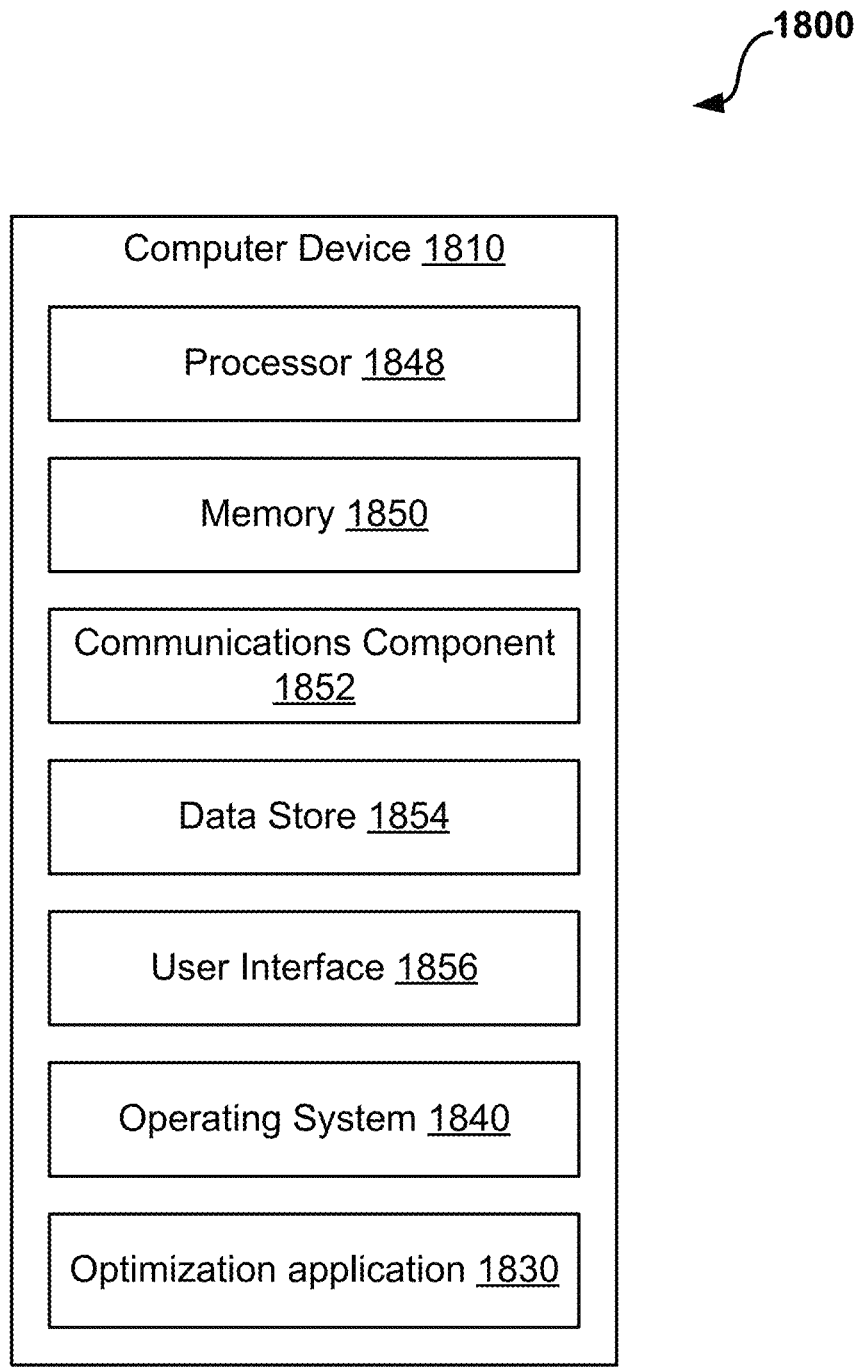
FIG. 18 is a block diagram that illustrates an example of a device for performing automated optimization of large-scale quantum circuits with continuous parameters in accordance with aspects of this disclosure.

Referring now to a diagram 1800 in FIG. 18, illustrated is an example computer device 1810 in accordance with an implementation, where the computer device 1810 may be used to perform the various optimization algorithms described above, including the various optimization subroutines and the Light and Heavy versions of the optimizer. The computer device 1810 can represent a single computing device, multiple computing devices, or a distributed computing system, for example. The computer device 1810 may be configured to execute or perform the automated optimization of quantum circuits, including automated optimization of large-scale quantum circuits with continuous parameters, as described herein. Moreover, the computer device 1810 may be configured to receive information about the quantum circuits (e.g., a netlist) and generate new information (e.g., a new netlist) after the optimization such that the number of quantum gates needed to implement the quantum circuits (or the functionality of the quantum circuits) is less than the number of quantum gates originally needed (e.g., prior to the optimization) to implement the quantum circuits (or the functionality of the quantum circuits).

In one example, the computer device 1810 may include a processor 1848 for carrying out processing functions associated with one or more optimization functions or operations described herein. The processor 1848 can include a single or multiple set of processors or multi-core processors. Moreover, the processor 1848 can be implemented as an integrated processing system and/or a distributed processing system. In an implementation, for example, the processor 1848 may include a central processing unit (CPU), a graphics processing unit (GPU), a tensor processing unit (TPU), or a combination of one or more of these types of units, which can be configured to perform one or more of the optimization functions or operations described herein.

In an example, the computer device 1810 may include a memory 1850 for storing instructions executable by the processor 1848 for carrying out the functions described herein. In an implementation, for example, the memory 1850 may correspond to a computer-readable storage medium that stores code or instructions to perform one or more of the optimization functions or operations described herein.

Further, the computer device 1810 may include a communications component 1852 that provides for establishing and maintaining communications with one or more parties utilizing hardware, software, and services as described herein. The communications component 1852 may carry communications between components on the computer device 1810, as well as between computer device 1810 and external devices, such as devices located across a communications network and/or devices serially or locally connected to computer device 1810. In one example, the communications component 1852 may provide communication of information between the computer device 1810 and a quantum information processing (QIP) system such that optimized netlists or the like are provided to the QIP system once produced by the computer device 1810. In another example, the communications component 1852 may include one or more buses, and may further include transmit chain components and receive chain components associated with a transmitter and receiver, respectively, operable for interfacing with external devices.

Additionally, the computer device 1810 may include a data store 1854, which can be any suitable combination of hardware and/or software, that provides for mass storage of information, databases, and programs employed in connection with implementations described herein. For example, the data store 1854 may be a data repository for operating system 1840 and/or optimization application 1830. In one implementation, the data store 1854 may include memory 1850.

The data store 1854 and/or the memory 1850 may be used to store information associated with pre-optimized circuits, post-optimized circuits, intermediate information produced during optimization, the optimization algorithms, including the subroutines and various versions of the optimizer, and any of the rules associated with the optimization operations described herein.

The computer device 1810 may also include a user interface component 1856 operable to receive inputs from a user of the computer device 1810 and further operable to generate outputs for presentation to the user. The user interface component 1856 may include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, the user interface component 1856 may include one or more output devices, including but not limited to a display, a speaker, a haptic feedback mechanism, a printer, any other mechanism capable of presenting an output to a user, or any combination thereof.

In an implementation, the user interface component 1856 may transmit and/or receive messages corresponding to the operation of the operating system 1840 and/or the optimization application 1830. In addition, the processor 1840 may execute the operating system 1840 and/or the optimization application 1830, and the memory 1850 or the data store 1854 may store them. Moreover, the optimization application 1830 may be executed based on stored code or instructions to perform one or more of the optimization functions or operations described herein. For example, the optimization application 1830 may select between a Light version of the optimizer or a Heavy version of the optimizer and may implement the appropriate sequence of subroutines (and any operations within each of the subroutines) accordingly.

Figure 19:
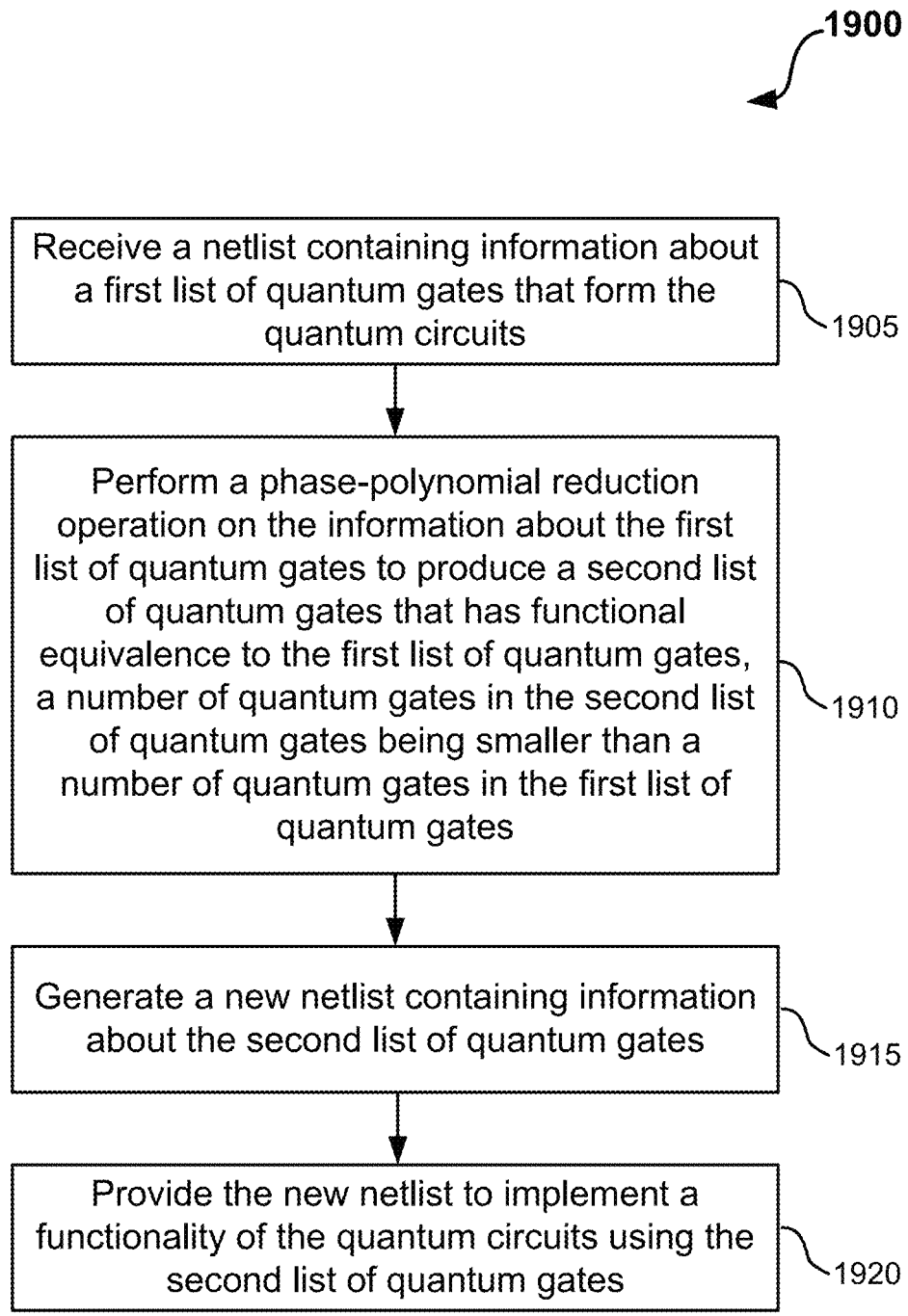
FIG. 19 is a flow chart that illustrates an example of a method for automated optimization of large-scale quantum circuits with continuous parameters in accordance with aspects of this disclosure.

FIG. 19 is a flow chart that illustrates a process or method 1900 to perform an automated optimization of quantum circuits in accordance with aspects of this disclosure. Aspects of the method 1900 may be performed by hardware and/or software in the computer device 1810 shown in FIG. 18.

At block 1905, the method 1900 includes receiving a netlist containing information about a first list of quantum gates that form the quantum circuits. A list of quantum gates may permit a repetition of elements since quantum circuits may have duplicates of the same quantum gates.

At block 1910, the method 1900 includes performing a phase-polynomial reduction operation on the information about the first list of quantum gates to produce a second list of quantum gates that has functional equivalence to the first list of quantum gates, a number of quantum gates in the second list of quantum gates being smaller than a number of quantum gates in the first list of quantum gates.

At block 1915, the method 1900 includes generating a new netlist containing information about the second list of quantum gates.

At block 1920, the method 1900 includes providing the new netlist to implement a functionality of the quantum circuits using the second list of quantum gates.

In another aspect of the method 1900, a pre-processing operation may be performed prior to performing the phase-polynomial reduction operation. The pre-processing operation may be applied to NOT gates, CNOT gates, Toffoli gates, Hadamard gates, and $R_z$ gates.

In another aspect of the method 1900, a Hadamard gate reduction operation may be performed prior to performing the phase-polynomial reduction operation.

In another aspect of the method 1900, a single qubit gate cancelation operation may be performed prior to performing the phase-polynomial reduction operation.

In another aspect of the method 1900, a two-qubit gate cancelation operation may be performed prior to performing the phase-polynomial reduction operation.

In another aspect of the method 1900, performing the phase-polynomial reduction operation may include implementing a set of rewriting rules. The set of rewriting rules may include one or both of gate count preserving rewriting rules or gate count reducing rewriting rules.

In another aspect of the method 1900, one or more gate cancelation operations or gate reduction operations along with the phase-polynomial reduction operation may be performed iteratively.

In another aspect of the method 1900, a fixed sequence of optimization operations that includes the phase-polynomial reduction operation may be performed iteratively, where the phase-polynomial reduction operation is not the first optimization operation in the fixed sequence and is performed only once in the fixed sequence.

Figure 20:
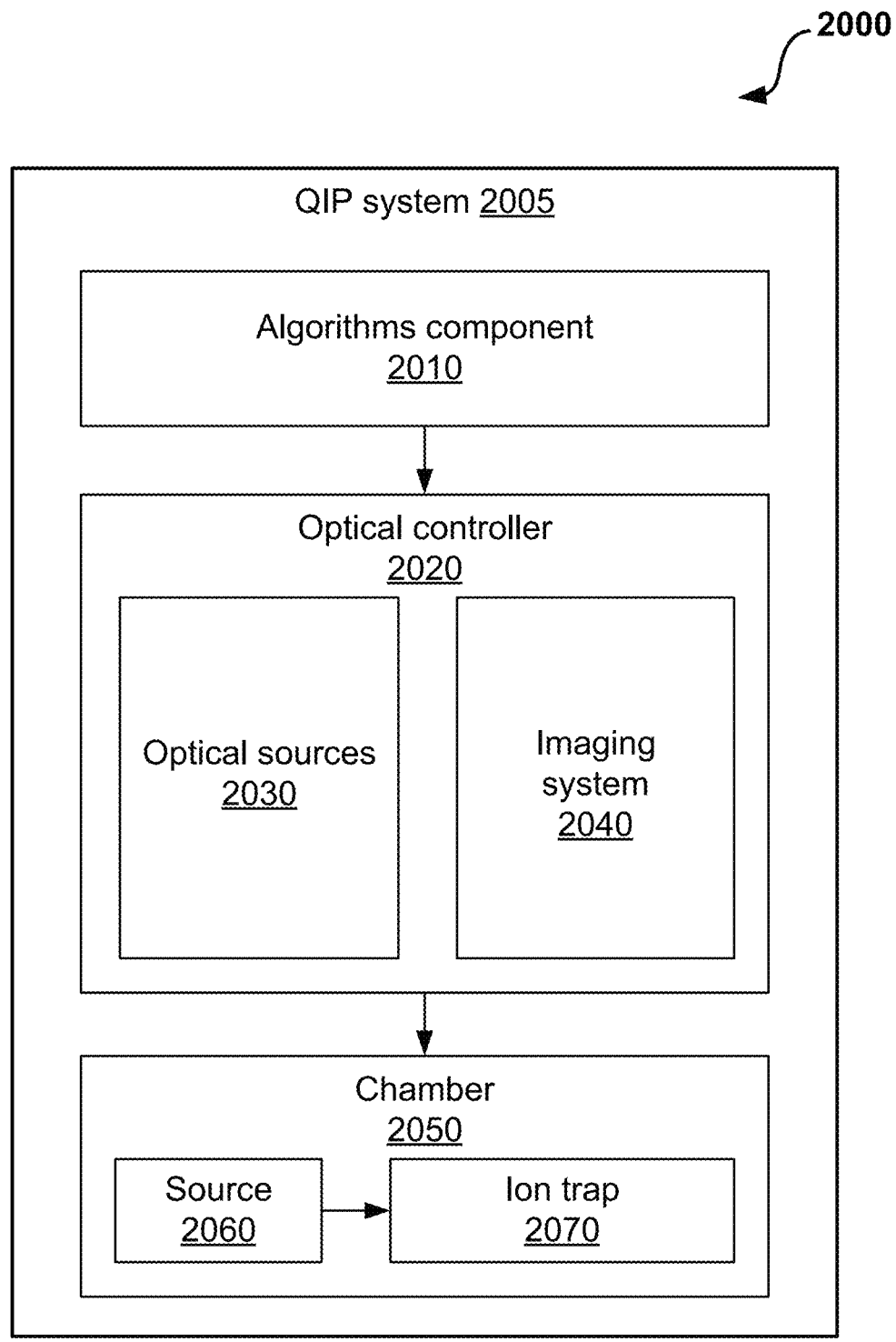
FIG. 20 is a block diagram that illustrates an example of a trapped-ion-based quantum information processing (QIP) system for implementing optimized large-scale quantum circuits in accordance with aspects of this disclosure.

FIG. 20 shows a diagram 2000 illustrating an example of a QIP system 2005 in accordance with aspects of this disclosure. The QIP system 2005 may also be referred to as a quantum computing system, a quantum computing network, a computer device, or the like. In an aspect, the QIP system 2005 may be used to implement or perform quantum computing operations or algorithms for which the fidelity of the quantum gates being implemented depends on the ability to have a tuned, stable laser output applied to, for example, trapped ions used as quantum bits. The QIP system 2005 may correspond to a quantum computer implementation of the computer device 1810 in FIG. 18 and/or a quantum computer that receives and implements the optimized results produced by running the optimization application 1830 (e.g., the proposed optimizer or optimization algorithms) in the computer device 1810 in FIG. 18.

The QIP system 2005 represents a trapped atomic ion version of a quantum computer and can include a source 2060 that provides atomic species to a chamber 2050 having an ion trap 2070 that traps the atomic species (e.g., trapped ions) once ionized by an optical controller 2020. Optical sources 230 in the optical controller 2020 may include one or more laser sources that can be used for ionization of the atomic species, control (e.g., phase control) of the atomic ions, for fluorescence of the atomic ions that can be monitored and tracked by image processing algorithms operating in an imaging system 2040 in the optical controller 2020.

The imaging system 2040 can include a high resolution imager (e.g., CCD camera) for monitoring the atomic ions while they are being provided to the ion trap 2070 (e.g., for counting) or after they have been provided to the ion trap 2070 (e.g., for monitoring the atomic ions states). In an aspect, the imaging system 2040 can be implemented separate from the optical controller 2020, however, the use of fluorescence to detect, identify, and label atomic ions using image processing algorithms may need to be coordinated with the optical controller 2020.

The QIP system 2005 may also include an algorithms component 2010 that may operate with other parts of the QIP system 2005 (not shown) to perform quantum algorithms (e.g., QFT, quantum simulations) that make use of the optimization techniques described above. The algorithms component 2010 may provide instructions to various components of the QIP system 2005 (e.g., to the optical controller 2020) to enable the implementation of quantum circuits, or their equivalents. That is, the algorithms component 2010 may allow for mapping of different computing primitives into physical representations using, for example, the trapped ions in the ion trap 2070 as qubits.

Although the present disclosure has been provided in accordance with the implementations shown, one of ordinary skill in the art will readily recognize that there could be variations to the embodiments and those variations would be within the scope of the present disclosure. Accordingly, many modifications may be made by one of ordinary skill in the art without departing from the scope of the appended claims.

What is claimed is:

1. A method for optimizing quantum circuits, comprising:
receiving a netlist representation and building a corresponding directed acyclic graph (DAG) representation from the netlist representation, the netlist representation and the DAG representation containing information about a first list of quantum gates that form the quantum circuits;
performing, based on the netlist representation and the DAG representation, a phase-polynomial reduction operation on the information about the first list of quantum gates to produce a second list of quantum gates that has functional equivalence to the first list of quantum gates, a number of quantum gates in the second list of quantum gates being smaller than a number of quantum gates in the first list of quantum gates, at least some of a reduction in the number of quantum gates between the first list of quantum gates and the second list of quantum gates being based on a continuous range of rotation angles, and the netlist representation and the DAG representation being updated concurrently whenever a reduction in the number of quantum gates in the first list of quantum gates is found as part of the phase-polynomial reduction operation;
generating a new netlist representation containing information about the second list of quantum gates; and
providing the new netlist representation to implement a functionality of the quantum circuits using the second list of quantum gates.

2. The method of claim 1, further comprising performing a pre-processing operation prior to performing the phase-polynomial reduction operation.

3. The method of claim 2, wherein the information about the first list of quantum gates to which the pre-processing operation is applied includes information about NOT gates, CNOT gates, Toffoli gates, Hadamard gates, and $R_z(\theta)$ gates.

4. The method of claim 1, further comprising performing a Hadamard gate reduction operation prior to performing the phase-polynomial reduction operation.

5. The method of claim 1, further comprising performing a single qubit gate cancelation operation prior to performing the phase-polynomial reduction operation.

6. The method of claim 1, further comprising performing a two-qubit gate cancelation operation prior to performing the phase-polynomial reduction operation.

7. The method of claim 1, wherein:
performing the phase-polynomial reduction operation includes implementing a set of rewriting rules, and
the set of rewriting rules includes one or both of gate count preserving rewriting rules or gate count reducing rewriting rules.

8. The method of claim 1, wherein the phase-polynomial reduction operation includes a reduction of $R_z(\theta)$ gates where a rotation angle $\theta$ is any value in a range between 0 and $2\pi$.

9. The method of claim 1, further comprising iteratively performing one or more gate cancelation operations or gate reduction operations along with the phase-polynomial reduction operation.

10. The method of claim 1, further comprising iteratively performing a fixed sequence of optimization operations that includes the phase-polynomial reduction operation, wherein the phase-polynomial reduction operation is not the first optimization operation in the fixed sequence and is performed only once in the fixed sequence.

11. A non-transitory computer-readable storage medium storing code that when executed by a processor causes the processor to perform an optimization of quantum circuits, comprising:
> code for receiving a netlist representation and building a corresponding directed acyclic graph (DAG) representation from the netlist representation, the netlist representation and the DAG representation containing information about a first list of quantum gates that form the quantum circuits;
> code for performing, based on the netlist representation and the DAG representation, a phase-polynomial reduction operation on the information about the first list of quantum gates to produce a second list of quantum gates that has functional equivalence to the first list of quantum gates, a number of quantum gates in the second list of quantum gates being smaller than a number of quantum gates in the first list of quantum gates, at least some of a reduction in the number of quantum gates between the first list of quantum gates and the second list of quantum gates being based on a continuous range of rotation angles, and the netlist representation and the DAG representation being updated concurrently whenever a reduction in the number of quantum gates in the first list of quantum gates is found as part of the phase-polynomial reduction operation;
> code for generating a new netlist representation containing information about the second list of quantum gates; and
> code for providing the new netlist representation to implement a functionality of the quantum circuits using the second list of quantum gates.

12. The non-transitory computer-readable storage medium of claim 11, further comprising code for performing a pre-processing operation prior to performing the phase-polynomial reduction operation.

13. The non-transitory computer-readable storage medium of claim 11, wherein the information about the first list of quantum gates to which the pre-processing operation is applied includes information about NOT gates, CNOT gates, Toffoli gates, Hadamard gates, and $R_z(\theta)$ gates.

14. The non-transitory computer-readable storage medium of claim 11, further comprising code for performing a Hadamard gate reduction operation prior to performing the phase-polynomial reduction operation.

15. The non-transitory computer-readable storage medium of claim 11, further comprising code for performing a single qubit gate cancelation operation prior to performing the phase-polynomial reduction operation.

16. The non-transitory computer-readable storage medium of claim 11, further comprising code for performing a two-qubit gate cancelation operation prior to performing the phase-polynomial reduction operation.

17. The non-transitory computer-readable storage medium of claim 11, wherein:
> the code for performing the phase-polynomial reduction operation includes code for implementing a set of rewriting rules, and
> the set of rewriting rules includes one or both of gate count preserving rewriting rules or gate count reducing rewriting rules.

18. The non-transitory computer-readable storage medium of claim 11, wherein the phase-polynomial reduction operation includes a reduction of $R_z(\theta)$ gates where a rotation angle $\theta$ is any value in a range between 0 and $2\pi$.

19. The non-transitory computer-readable storage medium of claim 11, further comprising code for iteratively performing one or more gate cancelation operations or gate reduction operations along with the phase-polynomial reduction operation.

20. The non-transitory computer-readable storage medium of claim 11, further comprising code for iteratively performing a fixed sequence of optimization operations that includes the phase-polynomial reduction operation, wherein the phase-polynomial reduction operation is not the first optimization operation in the fixed sequence and is performed only once in the fixed sequence.

* * * * *